United States Patent
Nakayoshi et al.

(10) Patent No.: US 6,310,667 B1
(45) Date of Patent: Oct. 30, 2001

(54) LIQUID CRYSTAL DISPLAY DEVICE AND FABRICATION METHOD THEREOF

(75) Inventors: Yoshiaki Nakayoshi; Kikuo Ono, both of Mobara (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/256,461

(22) Filed: Feb. 23, 1999

(30) Foreign Application Priority Data

Feb. 23, 1998 (JP) .................................................. 10-040167

(51) Int. Cl.[7] .......................... G02F 1/136; G02F 1/1333; H01L 29/04
(52) U.S. Cl. ............................... 349/42; 349/138; 349/54; 257/72
(58) Field of Search .................................. 349/42, 54, 55, 349/138, 149, 152, 192, 154, 43; 324/770

(56) References Cited

U.S. PATENT DOCUMENTS 6,091,470 * 7/2000 Fujikawa et al. ..................... 349/122
6,111,620 * 8/2000 Nishiki et al. .......................... 349/54

* cited by examiner

Primary Examiner—William L. Sikes
Assistant Examiner—Dung Nguyen
(74) Attorney, Agent, or Firm—Antonelli, Terry, Stout & Kraus, LLP

(57) ABSTRACT

A method and apparatus for suppressing errors in a disconnecting inspection of wiring lines formed over a TFT substrate utilized for a liquid crystal display panel due to a defective contact between an inspection probe and an inspection terminal. A liquid crystal display has a liquid crystal display panel including a pair of substrates and a liquid crystal layer with a plurality of gate lines and a plurality of data lines formed on a main surface of one of the substrates adjacent to the liquid crystal layer. The plurality of gate lines extend in one direction, and the plurality of data lines extend in another direction transverse to the one direction and are spaced from the plurality of gate lines by a first insulating film. Switching elements and pixel electrodes are formed on the main surface. At least one of at least one of the plurality of data lines and at least one of the plurality of gate lines is electrically connected with an inspection terminal, and the inspection terminal extends at least partially over a second insulating film covering at least two other data lines disposed at one side of the at least one data line or at least two other gate lines disposed at one side of the at least one gate line.

28 Claims, 22 Drawing Sheets

LIQUID CRYSTAL DISPLAY DEVICE AND FABRICATION METHOD THEREOF

BACKGROUND OF THE INVENTION

1. Field of the Invention

The present invention relates to an active matrix type liquid crystal display substrate having thin film transistors or the like as switching elements, a liquid crystal display device and a fabrication method thereof.

2. Description of Related Art

The active matrix type liquid crystal display device is provided with nonlinear elements (or switching elements) which correspond individually to a plurality of pixel electrodes arrayed in a matrix shape. Since the liquid crystals in the individual pixels are theoretically driven at all times (or a duty ratio of 1.0), the active type has a higher contrast than that of the so-called "simple matrix type" adopting the time sharing drive type, and is considered to be indispensable for the color liquid crystal display device. The switching elements are represented by thin film transistors (TFT).

Here, the active matrix type liquid crystal display device using the thin film transistors is disclosed, for example, in Japanese Patent Application Laid-Open No. 309921/1988 or in "12.5 Type Active Matrix Color Liquid Crystal Display" on pp. 193 to 210 of Nikkei Electronics issued on Dec. 15, 1986 by Nikkei McGraw-Hill.

The liquid crystal display panel (hereinafter referred to as the "liquid crystal display element" or "LCD") of the active matrix liquid crystal display device, comprises a pair of substrates confronting one another through the liquid crystal layer, at least one of which is transparent. One of the substrates generally has a plurality of gate lines extended in an x-direction and juxtaposed in a y-direction, and a plurality of data lines extended in the y-direction across the gate lines through an insulating film and juxtaposed in the x-direction, formed over its surface on the side of the liquid crystal layer. A region enclosed by those individual lines forms a unit pixel region, which is equipped with a thin film transistor and a pixel electrode. The aforementioned x-direction and y-direction are in a relation to extend along the substrate surface confronting the liquid crystal layer and to intersect each other (i.e., not in parallel). In most cases, the y-direction is defined to intersect the x-direction substantially perpendicularly, but this angle of intersection could be suitably changed according to the demand from the product design so that the directions are transverse to one another. The x-direction and the y-direction to be described hereinafter will be defined, as described hereinbefore, unless otherwise specified.

The pixel electrodes are fed with video signal voltages from data lines through the thin film transistors which are turned ON when fed with the scanning signal voltages from gate lines. As a result, an electric field is established (in the case of the vertical field type) between the pixel electrodes and a common pixel electrode formed on the other opposed substrate so that the optical transmittance of the liquid crystal layer interposed between the pixel electrodes and the common pixel electrode may be modulated to effect a predetermined display.

Moreover, the gate lines, data lines, thin film transistors and pixel electrodes are formed by forming different material layers into predetermined patterns by a selective etching method using the photolithography technique and by laminating the etched material layers sequentially. Such a liquid crystal display device is disclosed in detail in Japanese Patent Application Laid-Open No. 32651/1987, for example.

In the fabrication of the aforementioned substrate (hereinafter referred to as the "TFT substrate") on the side having the gate lines, data lines, thin film transistors and so on, defects occur resulting in disconnection of the gate lines and the data lines. During the step of fabricating the TFT substrates, therefore, the disconnections are inspected by measuring the electric resistances to select the proprieties of the product. This disconnection inspecting step is performed for all the wiring lines by using inspection terminals on the TFT substrate and a plurality of inspection probes prepared according to the interval of the inspection terminals. The technique of inspecting the disconnections of the adjoining wiring lines of the gate lines or data lines by connecting them in series is disclosed in Japanese Patent Application Laid-Open No. 124825/1989 or 1825/1990.

Both Japanese Patent Application Laid-Opens Nos. 124825/1989 and 1825/1990 describe the problem of gate dielectric breakdown due the static electricity in the process after the disconnection inspections. As a solution of the problem, although different in the two disclosures, there has been disclosed a construction of two adjoining gate lines, two adjoining data lines and a film of ITO short-circuiting one end of the gate lines and one end of the data lines. As a matter of fact, however, there is another problem to be solved in addition to the aforementioned defect occurrence due to the static electricity. This serious problem is that the TFT substrate conforming to the disconnection inspection (or having no wiring defect) is misjudged as being defective.

In the disconnection inspection, when the electric contact between the inspection probe and the inspection terminal is insufficient, the line (e.g., the gate line or the data line) connected with the inspection terminal is determined to be defective, and the TFT substrate having that line is rejected. Consequently, the yield in the number of supplied TFT substrates is reduced. This defective contact occurs mainly when the inspection probe and the inspection terminal are not positioned accurately. This problem becomes serious in the case of taking a plurality of TFT substrates from a large-sized glass substrate, or in the case of a high definition liquid crystal display device having inspection terminals arranged at narrow intervals. As a size of the glass substrate becomes larger, it is more difficult to retain its positioning accuracy.

Since the inspection probe or the inspection apparatus equipped with a plurality of inspection probes is prepared in conformity to the requirement of the products, different inspection probes corresponding in number according to the number of kinds of the products have to be prepared for fabricating the products simultaneously. This is apparent in view of Japanese Patent Application Laid-Open No. 199210/1995 which has disclosed a inspection terminal structure suited for a high definition liquid crystal display device. The inspection terminals disclosed thereby, are so different from those disclosed in Japanese Patent Application Laid-Open No. 124825/1989 that the disconnection inspection of the former cannot be performed by the apparatus used in the latter disconnection inspection.

SUMMARY OF THE INVENTION

An object of the present invention is to suppress the occurrence of inspection defects which might otherwise be caused by the defective contact between the inspection probes and the inspection terminals at the inspection of the disconnections of wiring lines.

Another object of the present invention is to enable the inspections of a plurality of kinds of products of different definition grades by using a common inspection probe.

In order to solve the above-mentioned problems, the present invention provides a liquid crystal display device comprising: a pair of substrates facing one another with a predetermined distance therebetween, at least one of the pair of substrates having a region provided for displaying an image therein; a liquid crystal layer sealed between the pair of substrates; and a plurality of first conductive members disposed on one of the pair of substrates so as to be substantially parallel to one another and to extend in a first direction, characterized in that (1) a first insulating layer is formed so as to cover the first conductive members other than at least one first recess exposing a portion of at least one of the first conductive members, and (2) at least one first terminal layer is electrically connected with the at least one of the first conductive members at the portion thereof exposed by the at least one first recess and extending from the at least one first recess at least partially over the first insulating layer above another of the first conductive members adjacent to the at least one of the first conductive members. The plurality of first conductive members are defined as a plurality of electrodes for driving liquid crystals in the passive matrix type liquid crystal display, and are defined as a plurality of wiring lines utilized for at least one of feeding electric signals to switching elements and applying voltages to pixel electrodes through the respective switching elements in the case of active matrix type liquid crystal display. The at least one terminal layer is provided for inspecting the disconnection of the at least one of the first conductive member. This structure is also characterized in that the at least one first terminal layer forms a step in a direction transverse to the first direction by extending from a portion contact with the at least one of the first conductive members in the recess of the first insulating layer to another portion over the first insulating layer formed above another of the first conductive members adjacent to the at least one of the first conductive members. This structure is named the first structure hereinafter.

In the first structure, the at least one first terminal layer is formed outside of the region provided for the image display (call "Display Region", hereinafter) of the substrate. The at least one first terminal may be connected at one end of the at least one of the first conductive member. Embodying the first structure, a plurality of the first terminal layers should be provided for at least two of the first conductive members respectively. Furthermore, the at least one of the first conductive member having the at least one first terminal layer and at least another of the first conductive members disposed by one side of the at least one of the first conductive members should be connected in series so as to form i.e. "wiring lines group". This wiring lines group preferably has the first terminal layers at both ends thereof, or has the terminals at one end thereof and connects another end with the other conductive member having a terminal portion. In either manner mentioned above, the at least one first terminal layer should be separated from another terminal for connecting the at least one of the first conductive members with an external circuit (e.g., for feeding an electric signal from a driver IC), and preferably the at least one first terminal layer should be disposed on the opposite side of the display region to the another terminal. In either embodiment, a plurality of the aforementioned first terminal layers appear over the substrate. These first terminal layers may be arranged in conformity to the respective first conductive members. An arrangement of the first conductive members corresponds to an arrangement of pixels (e.g., defined by an arrangement of pixel electrodes) in an array manner over the substrate, thus arranging the first terminal layers corresponding to such an arrangement of the first conductive members provides a high accuracy for the positioning of the inspection probes (or the sensing part of the inspection apparatus) at the disconnecting inspection by monitoring the shape of the first terminal layers. These first terminal layers arranged in a direction crossing the plurality of first conductive members, may be staggered or arranged alternately with a shift between the adjoining ones. In the case of repeating to connect the at least one of the first conductive members with at least another of the first conductive members juxtaposed on one side thereof in series, the terminals may be formed for each n-number or for an irregular repetition of n- and m-numbers (n, m≧1, and n ≠ m) in accordance with the interval of the first conductive members.

The first conductive members in the first structure mentioned above are defined to include not only the wiring lines for applying a voltage directly to the electrodes to drive the liquid crystal, but also the wiring lines for applying the voltage indirectly through the switching elements in the active matrix type liquid crystal display device, the wiring lines for feeding control signals to the switching elements, and the wiring lines for providing a capacity to retain the potential of the electrodes. Even if these wiring lines of different functions are arranged adjacent to each other over the substrate, the first structure may be applicable to such an arrangement so long as specific circumstances might arise.

In order to solve the above-mentioned problems with the active matrix type liquid crystal display device, the present invention also provides a liquid crystal display substrate having a main surface, on which: a plurality of gate lines extend in one direction; a plurality of data lines extend in another direction transverse to the one direction and are spaced from the plurality of gate lines by a first insulating film; switching elements are disposed to be turned ON with scanning signals fed through the gate lines; pixel electrodes for feeding video signals from the data lines through the ON switching elements are disposed; and a second insulating film covers at least partially both the plurality of gate lines and the plurality of data lines; characterized in that (1) at least one of at least two adjacent data lines and at least two adjacent gate lines are electrically connected by at least one wiring line, and (2) at least one of the adjacent data lines and the adjacent gate lines connected by the wiring line has an inspection terminal connected thereto which has portions provided on said second insulating film so as to extend at least partially over at least one of at least two other data lines disposed at one side of the at least one data line and at least two other gate lines disposed at one side of the at least one gate lines. This liquid crystal display substrate structure will be called the "second structure" hereinafter, because this structure retains the positioning accuracy of the inspection probes for the disconnecting inspection by enlarging an area of the inspection terminals in contrast to the foregoing first structure.

One of the preferable embodiments of the second structure is characterized in that the wiring lines are disposed at the end portion of the liquid crystal display substrate outside of substrate cutting lines.

Moreover, the present invention provides a liquid crystal display device comprising a liquid crystal display panel including: a pair of substrates and a liquid crystal layer, the pair of substrate being arranged to confront one another with the liquid crystal layer disposed therebetween; a plurality of gate lines and a plurality of data lines, both formed on a main surface of one of the substrates adjacent to the liquid crystal layer, the plurality of gate lines extending in one direction and the plurality of data lines extending in another direction transverse to the one direction and being spaced from the plurality of gate lines by a first insulating film; switching elements formed on the main surface to be turned ON with scanning signals fed through the plurality of gate lines; and pixel electrodes formed on the main surface for feeding video signals from the plurality of data lines through the ON switching elements, characterized in that at least one of at least one of the plurality of data lines and at least one of the plurality of gate lines is electrically connected with an inspection terminal, and the inspection terminal extends at least partially over a second insulating film covering at least one of at least two other data lines and at least two other gate lines disposed at one side of one of the at least one of the plurality of data lines and the at least one of the plurality of gate lines.

According to the present invention, there is further provided a process for fabricating a liquid crystal display panel for a liquid crystal display device comprising the steps of: (1) preparing a first substrate; (2) forming a plurality of gate lines and a plurality of data lines disposed on a first main surface of the first substrates so that the plurality of gate lines extend in a first direction, and the plurality of data lines extend in a second direction transverse to the first direction and are spaced from the plurality of gate lines by a first insulating film; (3) forming at least one wiring line on the first main surface for electrically connecting at least one of at least two adjacent ones of the plurality of data lines and the plurality of gate lines; (4) forming switching elements on the first main surface to be turned ON with scanning signals fed through the plurality of gate lines; (5) forming pixel electrodes on the first main surface for feeding video signals from the plurality of data lines through the ON switching elements; (6) arranging at least one inspection terminal for at least one of the plurality of data lines and the plurality of gate lines so as to extend at least partially over a second insulating film formed above at least one of at least two of the plurality of data lines and at least two of the plurality of gate lines; (7) arranging the first substrate and a second substrate so as to confront the first main surface to a second main surface of the second substrate with a space therebetween; and (8) sealing a liquid crystal layer in the space between the first and second main surfaces.

The process is further characterized in that the wiring lines are disposed at the end portion of the first liquid crystal display substrate outside of a substrate cutting line thereof.

The process should further comprise a step of cutting the one substrate and the wiring lines after a disconnection of at least one of the plurality of data lines and the plurality of gate lines was inspected utilizing the at least one inspection terminal. This step may be practiced, too, in the fabrication of the liquid crystal display device by using the substrate of the first structure.

Furthermore, the present invention provides another process for fabricating a liquid crystal display device comprising the steps of: (1) preparing a first substrate having a first main surface including a display region provided for displaying an image therein; (2) forming a plurality of first conductive members on the first main surface so as to be substantially parallel to one another and to extend in a first direction into the display region; (3) forming a first insulating film over the plurality of first conductive members; (4) forming a plurality of openings in the first insulating film, each of the opening being provided in at least one of the display region and a periphery of the display region and each of the openings formed in the periphery exposes a portion of at least one of the plurality of first conductive members; (5) forming a conductive film on the insulating film including the openings; and (6) removing portions of the conductive film so that the conductive film extending from the opening in the display region forms a pixel electrode on the first insulating film and the conductive film extending from the opening in the periphery of the display region extends at least partially over the first insulating film formed above another of the first conductive members adjacent to the at least one of the first conductive members. This process enables to form both the first terminal layer of the first structure and the inspection terminal of the second structure by common steps to fabricate pixel electrodes without any additional steps.

The characters of an insulating film or an insulating layer recommended to utilize as the first insulating layer in the first structure and the second insulating film in the second structure are described below. For convenience of explanation in following explanation, such an insulating film or an insulating layer is called "a second insulating film", regardless of the definitions described above. Therefore, it is noticed that a second insulating film which will be mentioned below also is recommended to utilize as the first insulating film covering the first conductive members in the another process for fabricating a liquid crystal display device.

In either liquid crystal display device, there are formed wiring lines for applying a voltage to at least the electrodes for driving the liquid crystal (called "pixel electrodes", hereinafter) over the substrate having a main surface on which the pixel electrodes are formed. Especially, as the pixel electrodes are arranged in an array and densely, the number of wiring lines is accordingly so increased as to make prominent the step appearing over the substrate (i.e., the fluctuation in a direction of the substrate thickness with respect to its surface). For the image display using the liquid crystal layer, on the other hand, the orientation control of liquid crystal molecules to be sealed is important, and it is required to orient the liquid crystal molecules in a predetermined direction on the uppermost surface (i.e., the growth surface over the main surface on which the pixel electrodes are to be formed) of the substrate to which the electric field is applied. For this requirement, it is necessary to reduce the aforementioned step of the surface on which the orientation film (called "alignment film", also) contacting with the liquid crystal layer is to be formed. The second insulating film is grown to solve this problem.

This second insulating film is characterized in that the steps existing on the surface thereunder are so reduced on the grown surface (or the upper surface) thereof that the second insulating film can be discriminated another insulating film for a different growth purpose by a cross sectional image of a transmission electron microscope.

In comparison with the second insulating film, the first insulating film utilized in the liquid crystal display substrate and device having the second structure and the process for fabricating a liquid crystal display panel for a liquid crystal display device should be formed as another insulating film known as "a gate insulating film". The characteristics of the gate insulating film formed in the active matrix type liquid crystal display device having the switching elements (called "thin film transistors" in the liquid crystal display device) for each pixel are explained as follows.

When the field effect transistors are used as the switching elements, at least one of passages for applying the voltage to the electrodes for driving the liquid crystal has to be opened/closed in response to the video data. The region where the voltage application is opened/closed, is usually called the "channel". This channel is made of a film of amorphous silicon (as expressed by "a-Si") or polycrystalline silicon (as expressed by "poly-Si"). On the other hand, the electrodes for switching the voltage application are usually called the "gates", and applying an electric field (called "gate signal") to the channel through the insulating film (called "gate insulating film") thereby to control the number of carriers to pass therethrough. This number of carriers dominates the drive of the liquid crystal display, i.e., the orientation of liquid crystal molecules. Since the gray scale of the image to be displayed in the liquid crystal display device is delicately controlled by the orientation of the liquid crystal, it is required to apply a voltage according to the gate signal with neither dispersion nor fail to the liquid crystal at the individual pixels of the liquid crystal display device. In order to satisfy this requirement, it is necessary to control the characteristics of the gate insulating film which determines the relation between the gate signal and the number of carriers to pass through the channel.

The difference between the purposes to form the second insulating film and the gate insulating film appears in the density of the films (as the density of the gate insulating film may be higher than that of the second insulating film), for example. Often, the gate insulating film is grown in the step in succession to the growth of the channel, but the second insulating film at another step different from the former step. Although the gate insulating film and the second insulating film are made of a material having an identical element composition, their junction interface may be discriminated, or the density contrast may be made with the cross sectional image by the transmission electron microscope. In order to reduce the step of the grown surface, still moreover, the second insulating film may be made thicker than the gate insulating film.

According to the comparison between the gate insulating film and the second insulating film described above, covering the first conductive members or the data and gate lines with the second insulating film and forming pixel electrodes thereover provides an advantage to apply a drive voltage to the liquid crystal layer by the pixel electrodes. The second insulating film may be divided into two layers to form the pixel electrodes in between and the orientation film thereover. In the passive matrix type liquid crystal display device having neither the gate lines nor other wiring lines equivalent thereto, the second insulating film exhibits a difference from other insulating film (e.g., an insulating film to be formed between the wiring lines and the substrate for retaining an adhesiveness of the wiring lines to the substrate), although not so clear as that for the difference from the gate insulating film.

Advantages of the first and second structures for a disconnecting inspection are described below. In the first structure of the present invention previously described, the at least one first terminal layer has a step between its contact portion with the at least one of the first conductive members in the first recesses and its another portion over the first insulating layers, thus the positioning error between an inspection probe array (a device having a plurality of inspection probes arranged for electric contacts with the inspection terminals) and the at least one first terminal layer (as an inspection terminal) during the disconnecting inspection are drastically reduced. In the conventional method in which the inspection probe array and the inspection terminals are positioned with respect to the marks prepared on the substrate, an error in positioning the respective inspection probes onto the respective inspection terminals causes the problem that the inspection probes are partially damaged. By an erroneous inspection result of a wiring line by the damaged inspection probe, a substrate having no disconnection in its wiring lines is judged to have a disconnection and rejected. According to the first structure, however, the position data conforming to the actual arrangement of the inspection terminals can be transmitted to the position control system of the inspection probe array by monitoring the above-mentioned step of the inspection terminals optically or electrically. As a result, an inspection probe of the inspection probe array can be contacted to a predetermined inspection terminal on an upper surface of the substrate for a disconnecting inspection, then raised away from the predetermined inspection terminal not to hit any bump on the upper surface, and brought to another inspection terminal to be inspected next.

The structure having the inspection terminals higher than the wiring lines to be inspected in the semiconductor integrated circuit device, is disclosed in Japanese Patent Application Laid-Open No. 142053/1992. However, this gazette has failed to disclose the concept that in view of the motion of the inspection probes of the liquid crystal display substrate, the terminals are extended over the wiring lines adjoining to the wiring lines to be inspected thereby to retain the contact faces of the inspection probes and their positioning reference.

In the second structure of the invention, on the other hand, the planar size of the inspection terminal for two or more data lines or gate lines can be enlarged by connecting these data lines or gate lines electrically, by arranging the inspection terminals over the data lines or gate lines a part by the insulating film, and by inspecting the disconnections of the two or more data lines or gate lines commonly. With reference to one of the data line connected with the inspection terminal, two or more other data lines crossed by this inspection terminal and electrically connected (preferably in series) with this data line, are arranged to correspond to the arrangement of the pixel electrodes connected therewith. Therefore, the inspection terminals crossing the other data lines has a shape extending along the scanning direction of the inspection probe array. The aforementioned damage of the inspection probes often occurs at the scanning time of the inspection probe array mounting the inspection probes, that is, at the moving time from one metering position to another. Against this problem, the inspection terminals, as formed widely over the second insulating film, can sufficiently suppress in their surface roughness so that the damage probability can be reduced even if the inspection probes rub with the surface of the inspection terminals. The advantage of enlarging the area of the inspection terminals is effective when it is impossible to retain the mechanical positioning accuracy sufficiently for the pitch of the data lines or gate lines when the inspection probe of the disconnection inspection apparatus is brought into contact. Even when the inspection probe is damaged to have its end bent, the mistaken positioning between the inspection probe and the inspection terminal can be corrected to suppress the defective inspection of the disconnection.

By adjusting the size of inspection terminals, when provided, in accordance with the sizes or definitions of the image display region, for example, the inspection probe can be shared among a plurality of kinds of products having different definitions. As a result, it is possible to cut down the time for replacing the inspection probes and to improve the production efficiency in the process for fabricating the different kinds of products simultaneously.

The invention is advantageous when applied to data lines having a pitch one third as small as that of gate lines, but could be applied both to the gate lines and to both the data lines and the gate lines as well. The invention could be further applied to the data lines or gate lines of the vertical field type or the lateral field type active matrix liquid crystal display device, the FAC (Flip Chip Attachment), i.e., COG (Chip ON Glass) type liquid crystal display device, or the band-shaped transparent pixel electrodes of the simple matrix type liquid crystal display device.

As to the static electricity problems having been discussed in Japanese Patent Application Laid-Open No. 124825/1989 or 1825/1990, no problem has arisen even if any of the aforementioned structures is adopted. The defective element due to the static electricity may occur more at the substrate transferring time than at the substrate cutting time, but this probability has been so low as can be ignored as compared with the problems to be solved by the invention. The static electricity problem at the substrate transferring time is considered to occur when a charged object (or the manipulator or the hand of a worker) contacts with the substrate. At this step, two or more at least either of the data lines or gate lines are kept connected in series. When an static electricity steals into one of the gate lines intersecting the wiring lines which are connected in series with an x-number of data lines, for example, the voltage rise at each transistor can be suppressed to 1/x because the x-number of drain electrodes or source electrodes of transistors which are subjected to the resultant voltage rise are arranged in series. In addition, the voltage rise is further reduced to 1/xy if a y-number of gate lines are connected in series. Since the voltage rise, as might otherwise cause the dielectric breakdown, is suppressed by distributing it into the plurality of transistors, it is estimated that the aforementioned static electricity problem is not actualized. With this estimation, it seems that the series wiring lines of the data lines having a tendency for the wiring capacity to become lower than that of the gate lines exhibit an effect to solve the static electricity problem.

When the first structure of the invention is applied to the passive matrix type liquid crystal display device, moreover, there exists no element which might otherwise be broken by the static electricity between the pixel electrodes and the wiring lines for feeding the electric signal. It is, therefore, apparent that the aforementioned effect could be extracted even if the adjoining wiring lines are not wired in series at the disconnection inspecting time. This also holds in the active matrix type liquid crystal display device. This is because the trouble per se due to the static electricity has an extremely low probability to occur.

DETAILED DESCRIPTION

Figure 1:
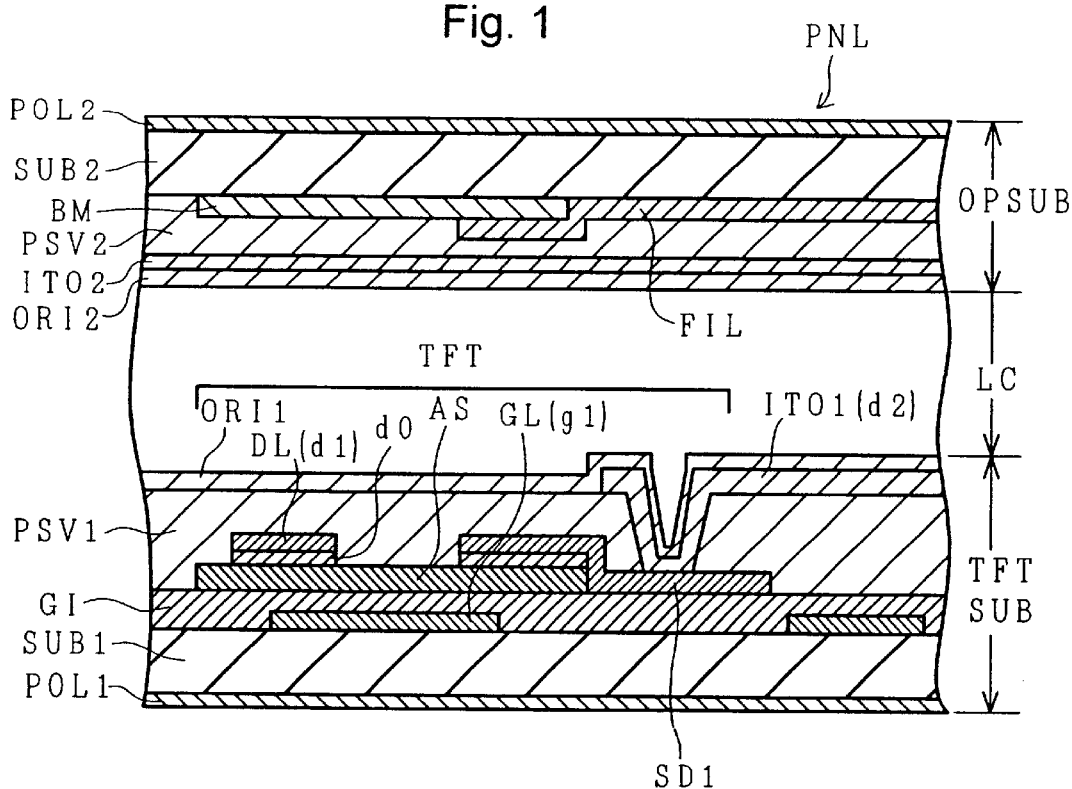
FIG. 1 is a section (or a section corresponding line 1A—1A of FIG. 2) of a liquid crystal display panel PNL.

With reference to the accompanying drawings, the liquid crystal display device and its structures related to the invention are described hereinafter. In the drawings for following explanations, the portions having identical functions will be designated by common reference numerals and characters, and their repeated descriptions will be omitted.

<<Liquid Display Panel PNL>>

FIG. 1 shows a cross section (taken along line 1A—1A of FIG. 2) of a portion of the liquid crystal display panel PNL from the intersecting portion between a gate line GL and a data line DL of a TFT substrate TFTSUB to a pixel electrode ITO1 and further crossing the gate line GL.

The liquid crystal display panel PNL is constructed by composing an enclosure of the so-called "TFT substrate TFTSUB" and its opposed substrate OPSUB, as arranged to confront each other through a predetermined gap, and by sandwiching a liquid crystal layer LC between the paired substrates. On the face of the TFT substrate TFTSUB on the side of the liquid crystal layer LC, there are formed the gate line (or a scanning signal line) GL, a thin film transistor TFT, the data line (or a video signal line or drain line) DL, the transparent pixel electrode ITO1 and so on. On the face of the opposed substrate OPSUB on the side of the liquid crystal layer LC, on the other hand, there are formed a shielding film (or black matrix) BM, a color filter FIL, a common transparent pixel electrode ITO2 and so on.

Figure 2:
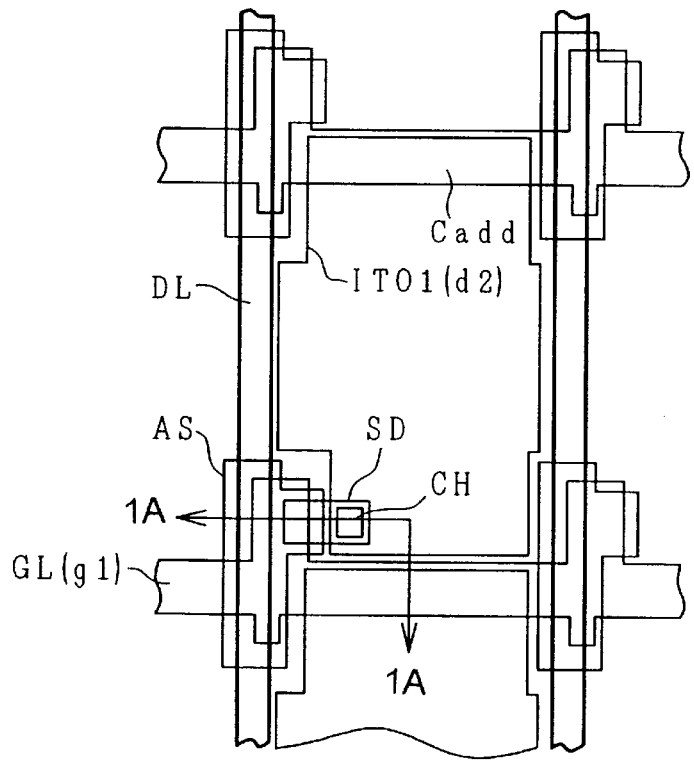
FIG. 2 is a top plan view showing an essential portion of a top plan pattern of a unit pixel and its peripheral area, as taken from the side of a liquid crystal layer LC of the TFT substrate TFTSUB.

Although not shown in FIG. 1, the thin film transistor TFT is turned ON by a scanning signal coming from the gate line GL so that the video signal from the data line DL is fed through the ON thin film transistor TFT to the pixel electrode ITO1 to establish between the pixel electrode ITO1 and the common pixel electrode ITO2 an electric field according to the voltage applied therebetween at the unit pixel (in the color display, three adjoining unit pixels form one pixel). As a result, the liquid crystal layer LC between the pixel electrode ITO1 and the common pixel electrode ITO2 is modulated to change its optical transmittance. For example, an optical beam from a back light which is not shown in FIG. 1 (denoted by BL in FIG. 3) and arranged below the TFT substrate TFTSUB in FIG. 2, is transmitted through the liquid crystal layer LC and the color filter FIL to the outside of the opposed substrate OPSUB, i.e., to the display observation side. In FIG. 1, reference characters SUB1 and SUB2 denote transparent glass substrates, ORI1 and ORI2 denote orientation films; and POL1 and POL2 denote polarization plates.

<<TFT Substrate TFTSUB>>

FIG. 2 is a plan view showing a portion of the unit pixel and its peripheral area, as taken from the side of the liquid crystal layer LC of the TFT substrate TFTSUB. On the face of the TFT substrate TFTSUB on the side of the liquid crystal layer LC, as shown in FIGS. 1 and 2, there are formed a plurality of gate lines GL spaced in parallel from each other, and a plurality of data lines DL spaced in parallel from each other and crossing those gate lines GL (insulated by an insulating film GI).

A region defined by two adjoining gate lines GL and by two adjoining data lines DL forms a pixel region, in which the pixel electrode ITO1 is formed all over the area. The thin film transistor TFT which operates as a switching element is formed for each pixel electrode ITO1 over the gate line GL, and its source electrode SD1 is connected with the pixel electrode ITO1. The scanning signal voltage to be fed to the gate line GL is applied to the gate electrode of the thin film transistor TFT (formed as a part of the gate line GL), and then turns ON the thin film transistor TFT. At this time, the video signal voltage fed to the data line DL is applied to the pixel electrode ITO1 through the source electrode SD1.

<<Gate Line GL>>

As shown in FIG. 1, the gate line GL is formed of a single layered conductor film g1. This conductor film g1 is made of an alloy of Cr (chromium) or Mo (molybdenum) or another refractory metal having a thickness of 600 to 3,000 Å (angstroms). In this example, the conductor film g1 is made of an alloy film of Cr and Mo (containing 50 wt. % of Cr and 50 wt. % of Mo) formed to have a thickness of about 2,000 Å by the sputtering method.

The data line DL is formed of a conductor film d1. This conductor film d1 is made of an alloy of a refractory metal such as Cr or Mo. In this example, the alloy used contains 70 wt. % of Cr and 30 wt. % of Mo. Another alloy may contain either 80 wt. % of Cr and 20 wt. % of Mo, or 50 wt. % of Cr and 50 wt. % of Mo.

<<Thin Film Transistor>>

As shown in FIGS. 1 and 2, the gate line GL is formed over the transparent glass substrate SUB1, and the gate insulating film GI, a semiconductor layer AS and so on are formed on the gate line GL to construct the thin film transistor TFT. For example, this thin film transistor TFT acts to lower the channel resistance between the source electrode SD1—the drain electrode (or the data line DL) in accordance with a bias voltage applied to the gate line GL, and to raise the channel resistance by reducing the bias voltage to zero.

The gate insulating film GI of silicon nitride, is formed over the gate electrode provided as a part of the gate line GL. The i-type semiconductor layer AS of amorphous Si (silicon) without impurities doped intentionally thereto, and an n-type semiconductor layer d0 of amorphous Si containing doped impurities thereto, are formed over the gate electrode in this order. Furthermore, the source electrode SD1 and the drain electrode (performed by the data line DL instead, unless it is specified otherwise) to construct the thin film transistor TFT are formed over the n-type semiconductor layer do.

Materials of the gate insulating film GI is selected for example as silicon nitride and formed by the plasma CVD method in a thickness of 2,000 to 5,000 Å (e.g., about 3,500 Å in this example). The i-type semiconductor layer AS is formed in a thickness of 500 to 2,500 Å (e.g., about 2,000 Å in this example). The i-type semiconductor layer AS is formed in a thickness of 500 to 2,500 Å (e.g., about 2,000 Å in this example). The n-type semiconductor layer d0 is provided for forming an ohmic contact with the i-type semiconductor layer AS and is formed of an amorphous Si semiconductor layer doped with P (phosphor).

For convenience of explanation in this specification, one of the electrodes of the thin film transistor TFT is called the source electrode and the other of the electrodes is called the drain electrode, regardless of each function. The names of the source electrode and the drain electrode are intrinsically determined depending upon the bias characteristics therebetween, but the polarities of the electrodes are inverted during the operation of the transistor so that the source electrode and the drain electrode are interchanged. Thus, for embodying the liquid crystal display device disclosed herein, even if the electrode defined as the drain should function as the source electrode and if the electrode defined as the source should function as the drain electrode respectively, the function of the liquid crystal display device is not affected.

<<Source Electrode SD1 >>

The source electrode SD1 is formed over the n-type Si semiconductor layer d0 and the gate insulating film GI, and is made of the conductor film d1.

<<Transparent Pixel Electrode ITO1>>

The pixel electrode ITO1 is formed of a transparent conductor film d2 of crystal indium tin oxide (ITO) or the like. This transparent conductor film d2 is formed of a sputtered ITO film having a thickness of 300 to 3,000 Å (e.g., about 1,400 Å in this example). Herein, the definition of "transparent conductor film" does not mean that this film does not absorb incident light into it, but means that its optical absorption is less than that of the conductive material constructing its periphery. One of its qualitative definitions can be described as a substance having an optical transmittance of 70% or more, desirably 80% or more in the visible range (i.e., in the range of wavelength of 380 to 770 nm) and having a conductivity equal to or more than that of the semiconductor. In other words, the transparent conductor film should not be limited to the present mainstream of the aforementioned ITO, as prepared by adding 1 to 5 wt. % of $SnO_2$ to $In_2O_3$, but the pixel electrode may be constructed by selecting another material with reference to the above-specified definition.

<<Storage Capacitance Cadd>>

As shown in FIG. 2, a storage capacitance Cadd is formed over the gate line GL on the opposed side (in the substrate surface direction) to the side on which the thin film transistor TFT is formed, and is constructed of a capacitance of the overlapped region of the pixel electrode ITO1 extending over the gate line GL through the insulating film GI and a passivation film PSV1. This storage capacitance Cadd functions to prevent the attenuation of the capacitance of the liquid crystal layer LC and the voltage drop at the OFF time of the thin film transistor TFT.

<<Passivation Film PSV1>>

As shown in FIGS. 1 and 2, the surface of the TFT substrate TFTSUB on the side of the liquid crystal layer LC in which the thin film transistor TFT or the like is formed, is covered with the passivation film PSVl other than the portion at which the pixel electrode ITO1 and the source electrode SD1 are electrically connected, and a part of the terminal portions of the gate line GL and the data line DL formed in a periphery of the TFT substrate TFTSUB.

The passivation film PSV1 is formed mainly so as to protect the thin film transistor TFT from moisture or the like and is made of a silicon oxide film or silicon nitride film having a thickness of 2,000 to 8,000 Å. In this example, moreover, the passivation film PSV1 prevents the short-circuiting defect of the data line DL and the pixel electrode ITO1. More specifically, the data line DL and the pixel electrode ITO1 can be prevented from short-circuiting even if they are overlapped due to the working defect of either of them in the fabrication process, because they are insulated and separated by the passivation film PSV1.

<<Opposed Substrate OPSUB>>

As shown in FIG. 1, the transparent glass substrate SUB2 is arranged to oppose the TFT substrate TFTSUB through a gap for the liquid crystal layer LC. On the face of the opposed substrate OPSUB on the side of the liquid crystal layer LC, there are sequentially laminated a shielding film (of black matrix) BM, the color filters FIL of red, green and blue colors, a passivation film PSV2, the common transparent pixel electrode ITO2 and the orientation film ORI2.

At the face on the opposite side of the opposed substrate OPSUB with respect to the liquid crystal layer LC, on the other hand, there is adhered the polarizing plate POL2, which polarizes the transmitted light together with the polarizing plate POL1 provided on the face of the TFT substrate TFTSUB on the opposite side with respect to the liquid crystal layer LC.

The shielding film BM is made of a Cr sputtered film, an organic resin film of black color, or a graphite film and plays the roles of the black matrix to shield the light, to separate the light into a frame shape for each pixel electrode ITO1 and to improve the contrast.

<<Entire Construction of Liquid Crystal Display Module>>

Figure 3:
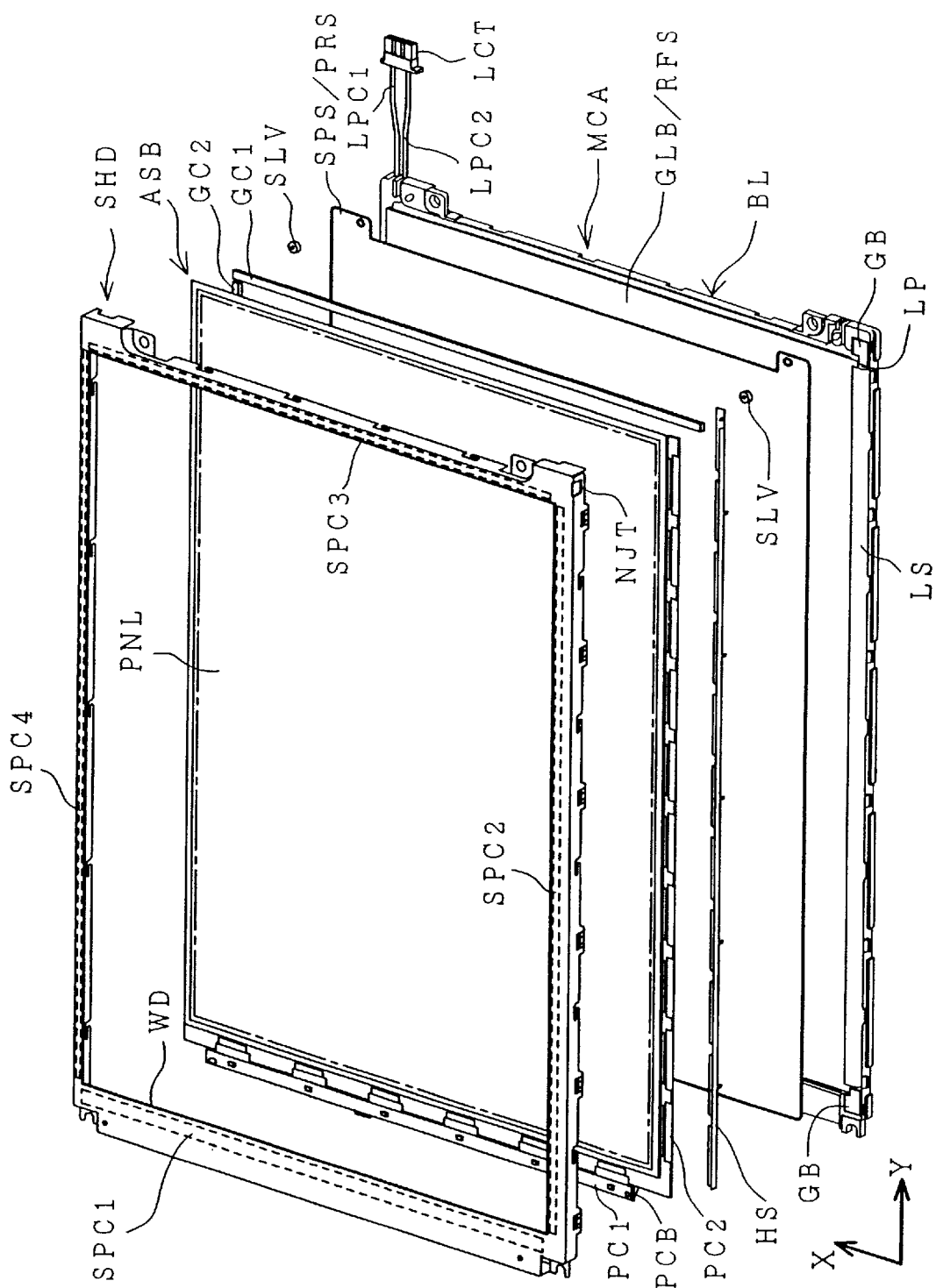
FIG. 3 is an disassembled perspective view of a liquid crystal display module of the FCA type to which the invention can be applied.

FIG. 3 is a perspective view showing a dismantled liquid crystal display module MDL packaging the liquid crystal display panel PNL. There are two kinds of packaging style for mounting a driver circuit of the liquid crystal display device (called driver IC) on its panel. One is called "Tape Carrier Package" type, and another is called "Flip Chip Attachment" type. FIG. 3 is based on the liquid crystal display module packaged by the latter type, but most of its elements are in common with that packaged by the former type.

In FIG. 3, the reference character SHD denotes a shield case (also called a metal frame) made of a metal sheet, WD denotes a display window, SPC1 through SPC4 denote insulating spacers, FPC1 and PFC2 denote folded multi-layer flexible circuit substrates (FPC1 denotes a gate side circuit substrate, and PFC2 denotes a drain side circuit substrate, respectively), PCB denotes an interface circuit substrate, ASB denotes a liquid crystal display element having an assembled drive circuit substrate, PNL denotes the liquid crystal display panel having the driver IC mounted on one of the two superposed transparent insulating substrates, GC1 and GC2 denote rubber cushions, PRS denotes a couple of prism sheets, SPS denotes a diffusion sheet, GLB denotes an optical guide plate, RFS denotes a reflection sheet, MCA denotes a lower case (a mold case) formed by the integral molding method, LP denotes a fluorescent lamp (bulb), LPC denotes a lamp cable, LCT denotes a connector for an inverter, and GB denotes a rubber bushing for supporting the fluorescent lamp. These individual members are stacked in the illustrated vertical arrangement to assemble the liquid crystal display module MDL.

<<Data Processing Packaging Liquid Crystal Display Module MDL>>

Figure 4:
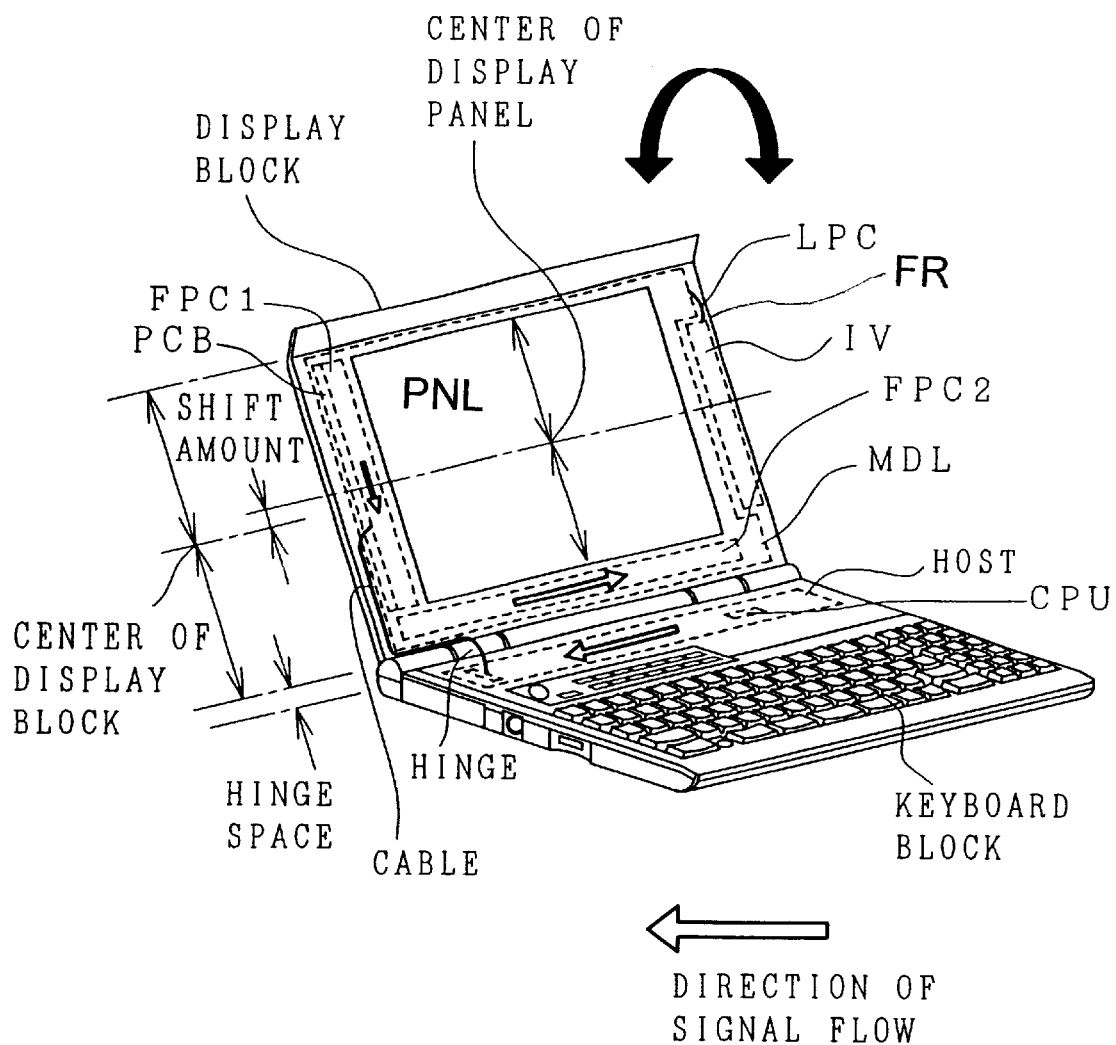
FIG. 4 is a perspective view of a notebook type personal computer or word processor having the liquid crystal display module of FIG. 3 packaged therein.

FIG. 4 is a perspective view of a notebook type personal computer or word processor having the liquid crystal display module packaged therein.

Embodiment 1
Terminal Structures for Disconnecting Inspections

The inspection terminal structures for inspecting disconnection of the data lines and the gate lines according to the present invention are described below.

<<Drain Inspection Terminal and Gate Inspection Terminal GTM>>

Figure 5A:
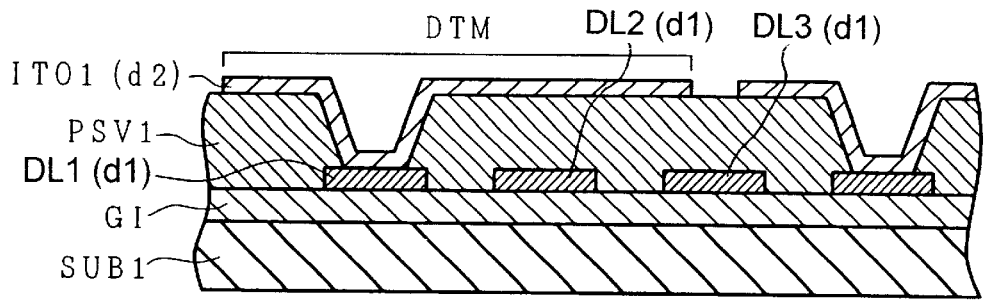
FIG. 5(a) is a cross section of a drain inspection terminal DTM portion along a data line DL (along line 5A—5A of FIG. 5(c)) of Embodiment 1 of the invention.
Figure 5B:
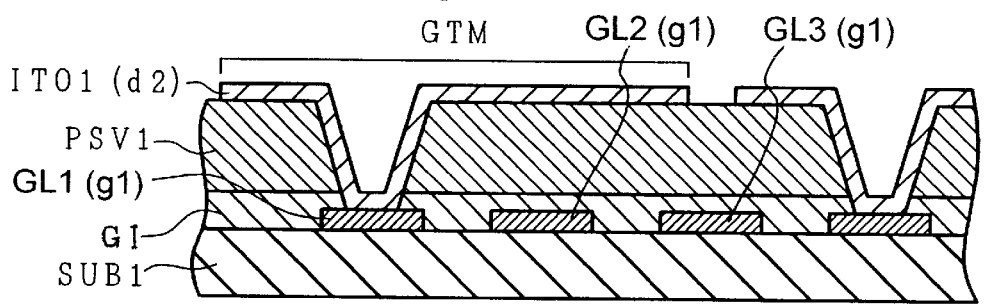
FIG. 5(b) is a cross section of a gate inspection terminal GDM portion along a gate line GL (or a section taken along line 5B—5B of FIG. 5(c))
Figure 5C:
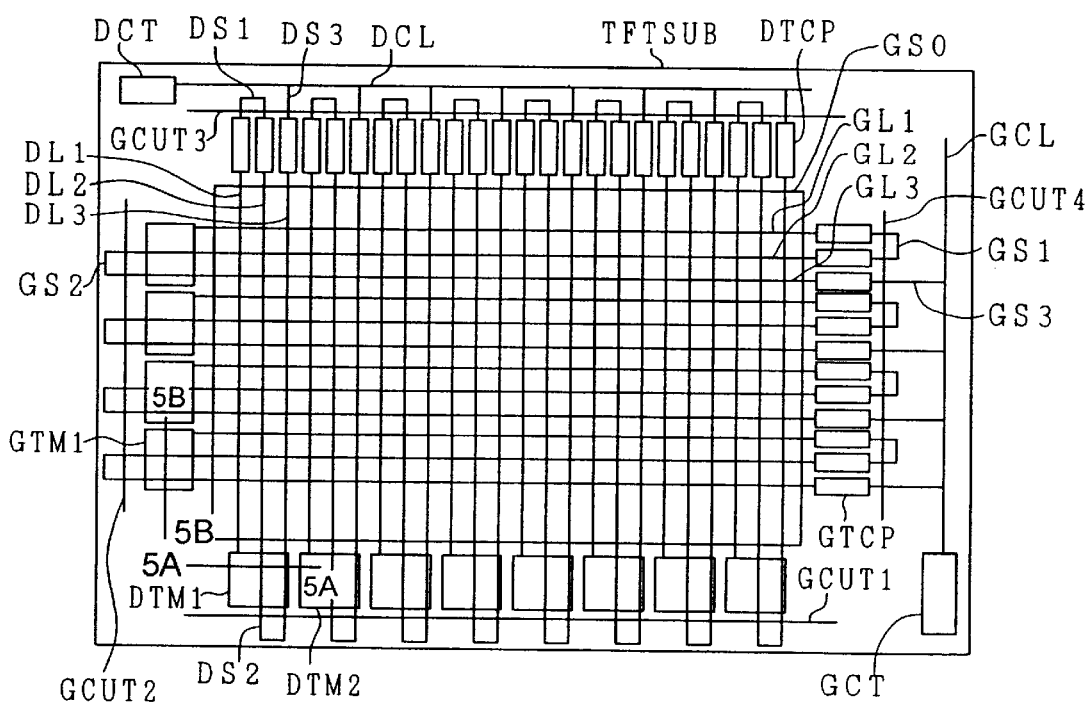
FIG. 5(c) is a schematic section of a TFT substrate TFTSUB before a cutting step.

FIG. 5(a) shows a cross section of the drain inspection terminal DTM portion (called the data line inspection terminal, also) as taken along the data line DL, FIG. 5(b) shows a cross section of the gate inspection terminal GDM portion (called the gate line inspection terminal, also) as taken along the gate line GL, and FIG. 5(c) shows a schematic section of the TFT substrate TFTSUB before a cutting step (explained later). In FIG. 5(a), the cross section is taken along line 5A—5A of FIG. 5(c). In FIG. 5(b), the cross section is taken along line 5B—5B of FIG. 5(c).

As shown in FIG. 5(a), the drain inspection terminal DTM is made of the conductor film d2 of ITO which is connected with the data line DL of the conductor film d1 through the passivation film PSV1 covering the conductor film d1. A drain terminal DTCP (shown in FIG. 5(c)), with which the TCP (Tape Carrier Package) mounting the drive IC chip is connected so that the voltage signal is applied to the data line DL from the outside, has a similar structure to that of the drain inspection terminal DTM. For the drain terminals DTCP, this connecting structure is formed for each of data lines DL. On the other hand, the drain inspection terminal DTM is formed for a plurality of data lines DL (three in this example). Moreover, the transparent conductor film d2 of the drain inspection terminal DTM and the transparent conductor film d2 of the transparent pixel electrode ITO1 are formed at a common step.

As shown in FIG. 5(b), the gate inspection terminal GTM is made of the conductor film d2 of ITO which is connected with the gate line GL of the con-ductor film g1 through the gate insulating film GI and the passivation film PSV1 covering the conductor film g1. A gate terminal GTCP (shown in FIG. 5(c)), with which the TCP mounting the driver IC chip is connected so that the voltage signal is applied to the gate line GL from the outside, has a similar structure to that of the gate inspection terminal GTM. For the gate terminals GTCP, this connecting structure is formed for each of gate lines GL. On the contrary, the gate inspection terminal GTM is formed for a plurality of gate lines GL (three in this example). Moreover, the transparent conductor film d2 of the gate inspection terminal GTM and the transparent conductor film d2 of the transparent pixel electrode ITO1 are formed at a common step.

In FIG. 5(c), reference characters GCUT1, GCUT2, GCUT3 and GCUT4 denote cut lines of the TFT substrate TFTSUB, GSO denotes a display region, DS1, DS2 and DS3 denote connection lines for electrically connecting every pluralities of (three in this example) data lines DL, DCL denotes a common short-circuiting line for short-circuiting these data lines DL commonly, DTCP denotes the drain terminal for inputting the data signal from the outside to be connected with the output terminal of the TCP, GS1, GS2 and GS3 denote connection lines for connecting the plurality of gate lines GL (three in this example), GCL denotes a common short-circuiting line for short-circuiting the gate lines GL commonly, GTCP denotes the terminal for inputting the gate signal from the outside to be connected with the output terminal of the TCP, DCT denotes an inspection terminal for inspecting the disconnection of the data lines DL, and GCT denotes an inspection terminal for inspecting the disconnection of the gate line GL.

Disconnecting Inspection Process

Disconnecting inspection using the above-mentioned inspection terminals DTM and GTM is explained below, wherein for simplifying explanations, the following description will relate mainly to the inspection for the data lines using the terminal DTM, with a similar method being applicable to that for the gate lines using the terminal GTM.

<<Data Line DL>>

Figure 6:
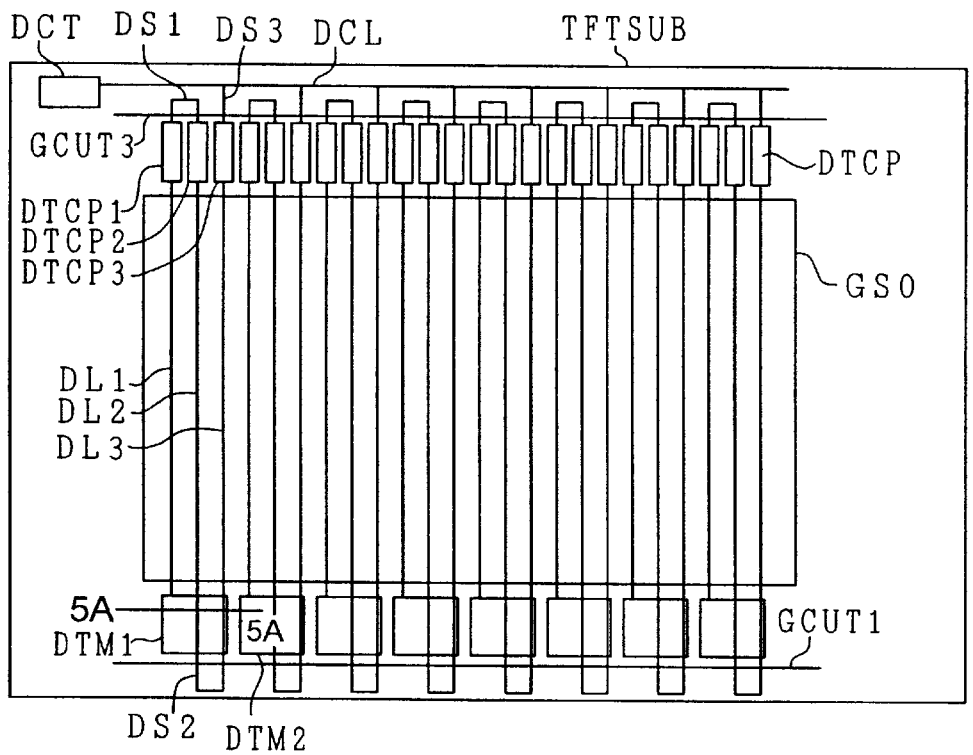
FIG. 6 is a view showing only the data line DL portion of the schematic top plan view of the TFT substrate TFTSUB of FIG. 5(c) before a cutting step.

FIG. 6 is a view corresponding to FIG. 5(c) and for ease of viewing showing only the data line DL portion of the schematic plan view of the TFT substrate TFTSUB of FIG. 5(c) before the cutting step (explained later). This embodiment is adapted for packaging the TCP-type driver IC.

The following explanation will be related to the three exemplary data lines (DL1, DL2 and DL3) of the plurality of data lines DL which are arranged over the TFT substrate TFTSUB. These data lines DL are electrically connected in the following manner to inspect their disconnections.

The drain terminals DTCP shown at the upper portions of FIG. 6, are provided to be electrically connected with the driver IC. The drain inspection terminals DTM shown at the lower portion of FIG. 6, are provided to establish an electric conduction with the inspection probe contacting thereto for inspecting the disconnection.

The lower drain inspection terminal DTM1 is connected with the data line DL1, which is connected with the upper drain terminal DTCP1. This drain terminal DTCP1 is connected through the connection line DS1 with its adjoining drain terminal DTCP2, which is connected with the data line DL2. The data line DL2 is not directly connected with the drain inspection terminal DTM1 but is insulated through the passivation film PSV1, as shown in FIG. 5(a). The data line DL2 is connected through the connection line DS2 with its adjoining data line DL3. This data line DL3 is connected with the drain terminal DTCP3, which is connected through the connection line DS3 with the common short-circuit line DCL. This common short-circuit line DCL is connected and provided with the inspection terminal (i.e. common inspection terminal) DCT for contacting with the inspection probe. Such layouts of these three data lines DL connected in series and having an inspection terminal in its end as mentioned above are repeatedly arranged along the common short-circuit line DCL and connected therewith for each.

Because the wiring connection construction of the gate lines GL is similar to that of the data lines DL, its explanation will be omitted (see FIG. 5(c)). Moreover, the connection terminal DTCP of the data lines DL with the external terminal will be described below with regard to Embodiment 3 and with reference to FIG. 28.

<<Disconnecting Inspection Process for Data Lines DL>>

The disconnecting inspection process is executed with a view to confirming the disconnections of the data lines DL and the gate lines GL and selecting a defective substrate.

The step of inspecting the disconnections in the data lines DL of the TFT substrate TFTSUB will be explained utilizing FIG. 7 which is an explanatory diagram for the step of inspecting a disconnection in the data line DL. The disconnecting inspection unit usually comprises a DC power supply unit PU for generating an arbitrary voltage, an inspection probe (or electric contact probe) PRO1 connected with the power supply unit PU, a DC ammeter CM, an inspection probe PRO2 connected with the ammeter CM, a stage STG supporting the TFT substrate TFTSUB to be inspected, and the drive units DR1 and DR2 for moving the inspection probes PRO1 and PRO2 vertically and horizontally respectively.

Figure 7:
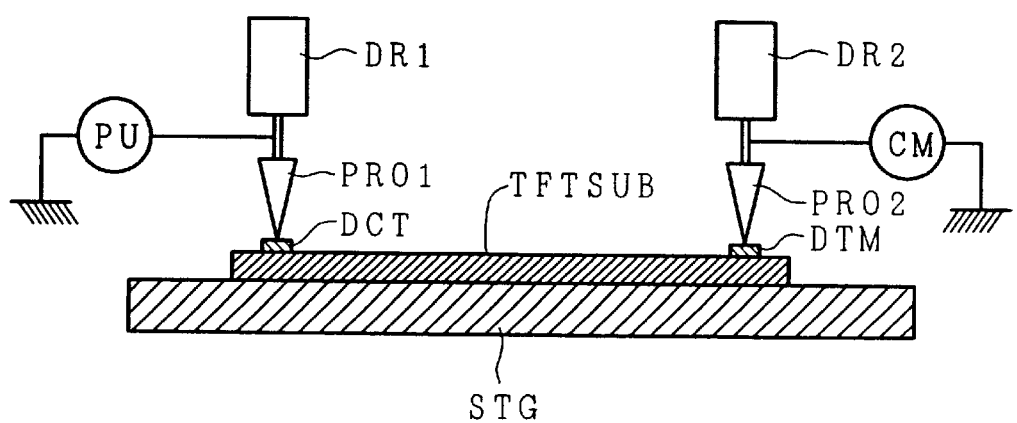
FIG. 7 is a diagram for explaining a step of inspecting a disconnection of the data line DL.
Figure 8A:
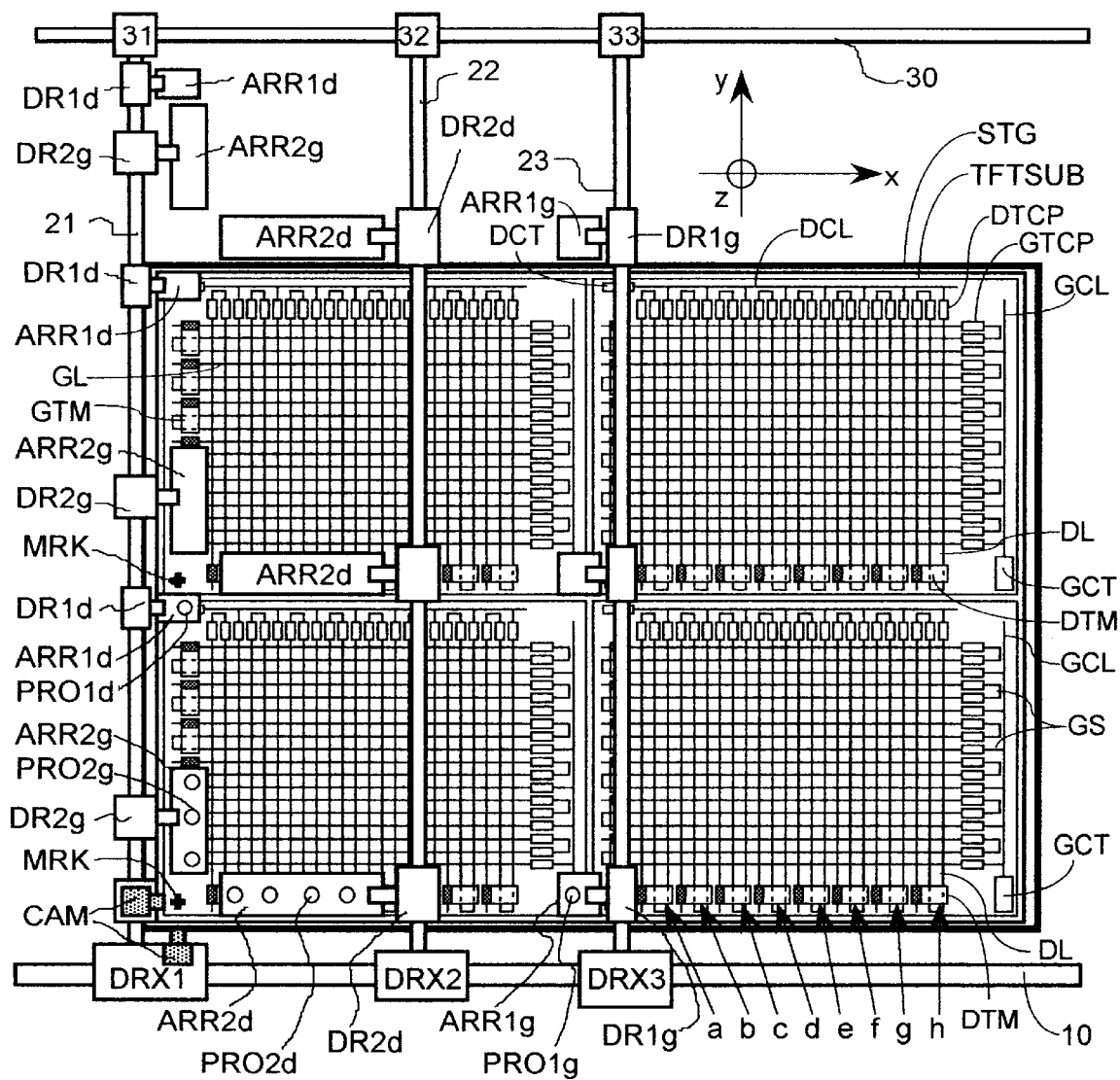
FIGS. 8(a) and 8(b) are diagrams schematically showing an apparatus for inspecting the disconnection of the liquid crystal display substrate.
Figure 8B:
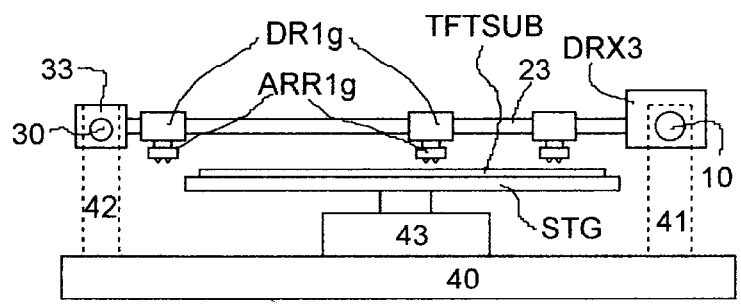

FIGS. 8(a) and 8(b) are diagrams schematically showing one example of an inspection apparatus for performing the disconnection inspection of FIG. 7 on a practical production line. FIG. 8(a) shows a disconnecting inspection in the case for fabricating four liquid crystal display substrates from a mother glass (0.7 mm thick, denoted by TFTSUB) having a surface size as large as 650 mm×830 mm. FIG. 8(a) shows that the inspection is performed at two regions fabricated for the liquid crystal display substrates on the left side of the mother glass. In FIG. 8(a), these regions have the first and second structures of the invention mentioned previously both in the data lines and in the gate lines.

Each component in FIG. 8(a) is denoted as PRO1g and PRO2g for the gate line disconnection inspecting probes, ARR1g and ARR2g for the probe arrays mounting those probes, and DR1g and DR2g for the drive units for moving those probe arrays on y- and z-axes of the coordinates shown in FIG. 8(a). In each reference numeral or character, the tail letter g indicates the component for the disconnection inspection for the gate lines, the next numeral 2 to the tail letter indicates the component used for the inspection probe contact to the inspection terminals GTM disposed at the end of the gate lines, and the next numeral 1 to the tail letter indicates the component used for the inspection probe contact to the inspection terminals GCT disposed at the aforementioned common short-circuiting line DCL. The disconnection inspecting apparatus of the data lines are likewise defined with the tail letter d indicating the relation to data lines. The individual drive units DR1g, DR2g, DR1d and DR2d are placed on any of rails 21 to 23, along which the movements in the y-axis direction are performed. These rails are supported by drive units DRX1 to DRX3 placed on another rail 10 extending in the x-axis direction and by opposed carriages 31 to 33 on another rail 30 extending in the x-axis direction, so that the positions of the probe arrays in the x-axis direction are adjusted by the movement of any of the drive units DDR1 to DRX3 in the x-axis direction. Three sets of probe arrays and drive units are provided individually for the gate lines and for the data lines and are prepared for fabricating nine liquid crystal display substrates from the mother glass at most. FIG. 8(b) shows the configuration of the aforementioned inspection probe apparatus suspended from the rails 21 to 23 as that for the inspection terminal GCT. The inspection apparatus is fixed in its entirety on a table 40 having a vibration preventing function or the like, and the rails 10 and 30 are installed at their individual two ends on the table by arms 41 and 42. The stage STG for mounting the mother glass (or the TFT substrate) is carried on another stage 43 which can be finely adjusted in the x- and y-axis directions.

Figure 9A:
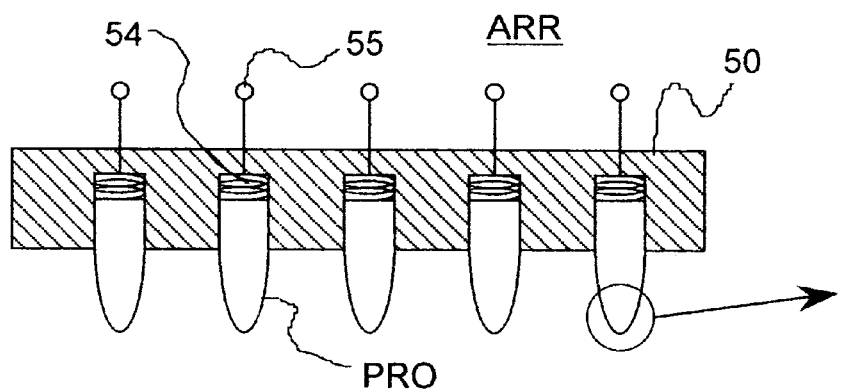
FIGS. 9(a) to 9(c) is a diagram schematically showing an inspection probe array to be used in the disconnection inspection apparatus or the like of FIGS. 8(a) and 8(b)
Figure 9B:
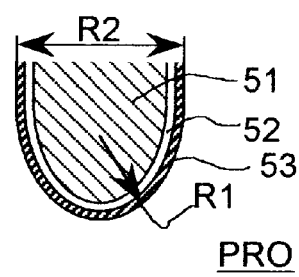
Figure 9C:
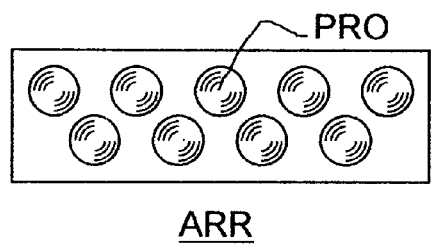

The probe PRO, as indicated by a circle in the probe array ARR in a portion of FIG. 8(a), cannot be seen actually from the upper side of the inspection face of the mother glass. The cross section of the probe array ARR is schematically shown in FIG. 9(a). The probe (or inspection probe) PRO has a cross sectional shape like a gun bullet having a curved end portion at its one side, as shown in FIG. 9(a). This curved end comes onto the surface of the inspection terminal. The curved end has a radius R1 of 20 μm, and the other cylindrical end has a diameter R2 of 100 μm. According to these values, these probes are large in comparison with the data line of 6 to 10 μm in width of the current products having a definition grade of XGA (described later). The probe PRO has a three-layer structure shown as FIG. 9(b) having a central portion 51 made of carbon steel or the like, a Ni (nickel) layer 52 coating the surface, and an Au (gold) layer 53 coating the Ni layer. The reason for enlarging the volume of the central portion 51 is to retain a mechanical strength than the electric conductivity. In the other end (or upper end) of the probe PRO, on the other hand, there is fitted an elastic member 54 such as a coil spring for damping the force to be applied to the probe PRO at the instant when the probe PRO comes into contact with the inspection terminal. Over the probe PRO, there is provided a port 55 which is electrically connected with the probe PRO for inputting/outputting the disconnection inspection signal. In the illustrated cross section of probe array ARR of FIG. 9(a), five probes are mounted in a housing 50 while being insulated from one another. FIG. 9(c) shows a bottom view of a probe array ARR wherein nine probes are arranged and represents an example of arranging probes for the inspection terminals of a layout which is different from that illustrated in FIGS. 6 and 8(a) and is adapted for a liquid crystal display substrate having its adjoining inspection terminals arranged in a shifted or staggered manner.

Even in a probe array prepared for preventing or minimizing the breakage, the probe PRO may break. This breakage will be explained with reference to FIG. 8(a). The probe array ARR is positioned by detecting a positioning mark MRK, marked in the region to be the liquid crystal display substrate on the mother glass TFTSUB, with a TV camera CAM or the like and by determining the scanning conditions of the probe array in conformity with the specifications (e.g., the diagonal length or fineness of the display region) of the liquid crystal display substrate to be inspected. These scanning conditions determine the stroke of the probe array movement according to the inspection terminal position determined by the specifications of the liquid crystal display substrate. According to the stroke, for example, the probe arrays ARR2g and ARR2d are sequentially moved (or scanned) in the X-axis direction and in the y-axis direction. However, there is an error between the scanning conditions determined exclusively by the condition setting with the positioning mark MRK and the actual motions of the probe arrays. In order to eliminate the error, reliable contact between the probe and the inspection terminal has been attempted in the product having a line pitch of about 90 μm by enlarging the width of the data lines locally to 30 to 50 μm, but without success.

The inventors have determined that a probe breakage occurs when the probe array ARR is scanned from an inspection position to a next inspection position. Moreover, the inventors have considered that the disconnecting inspection terminal structure of the liquid crystal display substrate disclosed in this embodiment has the following effects.

Figure 10:
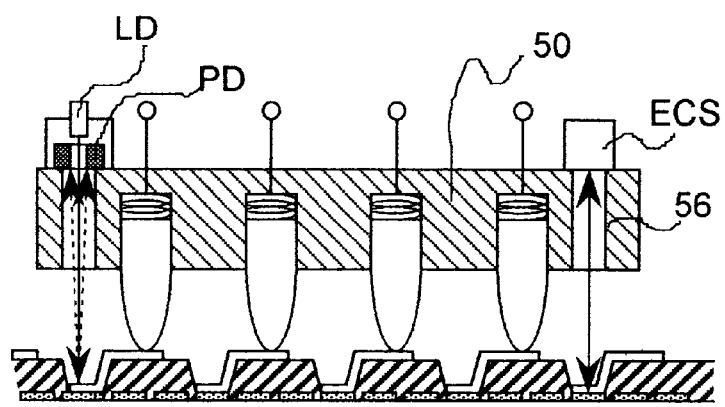
FIG. 10 is a diagram showing a structure in which an optical or electric positioning sensor is mounted on the inspection probe array.

From the viewpoint of the first structure of the invention, it is effective for retaining the positioning accuracy that recesses shown in FIGS. 5(a) and 5(b) appear in the individual inspection terminals DTM and GTM in accordance with the patterns of the data lines and the gate lines. As shown in FIGS. 5(a) and 5(b), the surfaces of the layer of ITO1 for the individual inspection terminals are extending along the main surface of the substrate SUB1, and divided into two portions across the slopes formed by the recesses. One is a lower portion contacting with the data lines DL or the gate lines GL, and another is a higher portion extending over the second insulating film PSV1 covering both the data lines and the gate lines. Inspecting the disconnection with the probe array shown in FIG. 9(a) and contacting its probes on to the higher portion of the ITO layer, at least one of the aforementioned recesses is not hidden by the shadow of the probe. Therefore, the recesses or the lower portion of the ITO layer extending thereto (dark colored portions in the terminals in FIG. 8(a)) can be monitored with the TV camera or the like, and the monitoring result can be fed back to the positioning of the probe array. When the inspection apparatus of FIG. 8(a) is to be employed, the TV camera CAM may be carried on the drive units DRX2 and DR2g. The insulating film PSV1 reduces undulations thereunder at its upper surface so that the recesses appearing in the upper surface are clearly seen. The arrangement of these recesses in accordance with that of the data lines DL or the gate lines GL enables its accurate image recognition by TV camera or enables easier recognition so as to make the inspection period shorter. Furthermore, the positioning accuracy can be drastically improved by mounting a sensing unit composed of a pair of a light emitting diode LD and a photo diode PD, or an eddy current detector ED in the housing 50 of the probe array shown as FIG. 10 so as to mark the recesses optically or electrically through a path 56. In FIG. 10, the optical sensor (LD, PD) is disposed at one end, and an electric sensor ECS is disposed at the other end. However, according to the inspecting condition, one of the sensors can be eliminated, or two or more optical or electrical sensors can be provided at both ends.

From the viewpoint of the second structure of the invention, the inspection terminal connected to the data line or the gate line extends across the other data lines or the other gate lines extending along the data line or the gate line. As shown in FIGS. 8(a) and 8(b), more specifically, the inspection terminals of the data lines are extended in the x-direction, in which the inspection probes of the probe array ARR2d for contact therewith are scanned. On the other hand, the inspection terminals of the gate lines are extended in the y-direction in which the inspection probes of the probe array ARR2g for contact therewith are scanned. This provides a margin for the positioning of the inspection probes at the scanning time of the inspection probe array. Even if the scanning operation is performed before the inspection probes are not sufficiently pulled up from the substrate surface, the inspection probe may just rub the inspection terminals and the probability of damage of the probe is drastically lowered.

Referring to FIGS. 6 and 7, for the disconnection inspecting method. In order to execute the disconnection inspections with the illustrated inspection apparatus, the TFT substrate TFTSUB is placed at first on the stage STG. Next, the inspection probes PRO1 and PRO2 are brought by the drive units DR1 and DR2 into contact with the inspection terminals DTM1 and DCT (in FIG. 6) on the TFT substrate TFTSUB. The voltage is applied from the power supply unit PU through the inspection probes PRO1 and PRO2 and the inspection terminals DTM1 and DCT to the data lines DL1, DL2 and DL3. The current value is measured by the ammeter CM, and the resistances of the data lines DL1 to DL3 are calculated to determine whether or not a disconnection has occurred. When the current value is lower than a predetermined lower threshold, a disconnection defect is determined. Next, the inspection probe PRO2 in contact with the inspection terminal DTM1 is brought by the drive unit DR2 into contact with a next detection terminal DTM2 to execute the disconnection inspection of the next data line (connected with the inspection terminal DTM2) adjacent to the set of DL1 to DL3. Thus, the inspection probe PRO2 is moved for the inspections by the drive unit DR2. In the case that the positioning is not satisfactory, or the end of the inspection probe PRO2 is bent, the inspection probe PRO2 fails to contact with the inspection terminal DTM so that the inspection current is lower than the lower threshold to invite a misjudgment of the disconnection.

In this embodiment, two or more (three, shown as FIG. 6) adjoining data lines DL are connected at the outside of substrate cut lines CUT1 and CUT2 of the TFT substrate TFTSUB by the connection lines DS1 and DS2. As shown in FIG. 5(a), the individual drain inspection terminals DTM are so arranged over the adjoining data lines DL through the passivation film PSV1 as to overlap the adjoining data lines DL planarly (as seen from the normal direction to the substrate). These two or more electrically connected data lines DL are commonly inspected on their disconnection. As a result, the area of the inspection terminals, with which the inspection probe PRO2 to be moved come into engagement, can be increased to reduce the misjudgment due to the defective positioning of the inspection probe PRO2. Specifically, when the mechanical positioning accuracy cannot be sufficiently retained for the pitch of the data lines DL at the time of bringing the inspection probe of the disconnection inspection apparatus into contact, or when the probe is damaged to have a bent leading end, the misalignment between the inspection probe and the inspection terminal can be suppressed to suppress the occurrence of the defective disconnection inspection.

Another inspection method to be applied to the disconnection inspection lines of this substrate shown in FIGS. 5(c) and 6, will be described in connection with the lower right substrate of the mother glass TFTSUB of FIG. 8(a) showing a layout of similar data lines thereto. Inspection terminals a to h are divided into first group of alternate inspection terminals a, c, e and g and second group of adjoining inspection terminals b, d, f and h. The potential of the first terminal group is set higher than that of the second terminal group (e.g., the first is set at a positive potential, and the second is set at a negative potential), and the electric currents are measured at the lines connected with the inspection terminals of the second group. If the current value at the terminal d is then lower than the decision value, it is determined that a disconnection may appear between the terminals d and c or the terminals d and e. Next, the potentials of the first terminal group and the second terminal group are inverted, and the currents are metered at the lines connected with the terminals of the first group. If the current value at the terminal c is lower than the decision value, it is determined that a disconnection is located between the terminals d and c. This method can be performed without providing the inspection terminal DCT at the common short-circuiting line DCL. Thus, this method does not need the inspection probe PRO1d, the probe array ARR1g and the drive unit DR1d shown in FIGS. 8(a) and 8(b), either. Thus, the construction of the inspection apparatus can be simplified. These advantages of the simplification in both the substrate and the inspection apparatus also apply to the disconnection inspection of the gate lines.

On the other hand, there are various standards in the definitions of the liquid crystal display device. The standards being or to be considered are enumerated in Table 1.

TABLE 1

| CLASS | DEFINITION | ASPECT RATIO |
|---|---|---|
| VGA | 640 × 480 | 4:3 |
| SVGA | 800 × 600 | 4:3 |
| XGA | 1024 × 768 | 4:3 |
| SXGA | 1280 × 1024 | 5:4 |

TABLE 1-continued

| CLASS | DEFINITION | ASPECT RATIO |
|---|---|---|
| UXGA | 1600 × 1200 | 4:3 |
| QXGA | 2048 × 1536 | 4:3 |
| QSXGA | 2560 × 2048 | 5:4 |
| QUXGA | 3200 × 2400 | 4:3 |

In Table 1, an aspect ratio means the longitudinal/transverse ratio of a display screen. In the case of black-and-white display, the definitions are made as a product of the number of data lines×the number of gate lines. For the color display, optical beams of three kinds of different wavelengths have to be emitted for the individual pixels. In other words, three kinds of pixels of red, green and blue colors, referred as "RGB", have to be prepared for the number of the aforementioned products. Thus, the data line number is three times as large as that of Table 1. Here, it is a problem that products of lower definitions (as located on the upper side of Table 1) have to be manufactured according to the demands although products of higher definitions are being shipped.

Under these circumstances, the invention exhibits its advantages for exploiting the inspection apparatus currently used for inspecting the disconnection of the liquid crystal display substrate. By adjusting the size of the drain inspection terminal DTM, the inspection probe is shared among the inspections for plural kinds of the products of the liquid crystal display panels PNL having different definitions. In view of the second structure of the invention, the number of wiring lines to be crossed by the inspection terminal is increased according to the grade of definitions so that the disconnection inspection may be performed by connecting the more data lines in series. In view of the first structure of the invention, on the other hand, the positioning control characteristics of the inspection apparatus are improved by adopting the probe array of FIG. 10, and the probes are made accordingly finer. In this case, the products of the lower definitions can be subjected to the disconnection inspection even if the data line inspection terminal is made so small as to cross one data line adjoining thereto. Thus, the disconnections of the substrates of the liquid crystal display devices having different definitions and screen sizes can be inspected by the predetermined inspection probe and the inspection apparatus having this inspection probe. This makes it possible in the process for manufacturing different kinds of products simultaneously to eliminate the time period for replacing the inspection probes thereby to improve the production efficiency.

The invention is effective for performing a plurality of inspections on one TFT substrate TFTSUB, as described above, and is further effective for the inspections for the so-called "multiple substrate manufacture" processes in which a plurality of TFT substrates TFTSUB are arranged at one glass substrate. In the case of the multiple substrate manufacture, the distances for the drive units DR1 and DR2 to move the inspection probes PRO1 and PRO2 (see FIGS. 7 and 8(a)) are so enlarged that it is difficult to retain the positioning accuracy sufficiently for the stage STG. For this difficulty, the invention can retain the positioning of the inspection probe PRO2 and the inspection terminal DTM satisfactory by enlarging the area of the inspection terminal DTM with which the inspection probe PRO2 is to contact.

<<Cutting Step of Connection Lines DS1 to DS3 and GS1 to GS3>>

The connection lines DS1 to DS3 connecting the data lines DL1 to DL3 (shown in FIG. 6) in series and forming current pass between the inspection terminals DTM and DCT have to be cut off before the practical use of the liquid crystal display substrate of FIG. 6 is assembled into a liquid crystal display device. The connection lines GS1 to GS3 (shown as FIG. 5(c)) are also required to be cut off by the same reason as that for the connection lines DS1 to DS3. Therefore, the cutting step of these connection lines is required after the disconnecting inspections mentioned before.

The step of cutting the connection lines DS1 to DS3 and GS1 to GS3 is described below. In this embodiment, the TFT substrate TFTSUB, as fabricated by the later-described fabrication process, and the opposed substrate OPSUB, as fabricated separately, are superposed with a predetermined gap therebetween and are adhered to each other. After this, the superposed substrates are cut into the contour of the TFT substrate TFTSUB at a cutting step of the glass substrate for the product contour. The data lines DL and the gate lines GL, as electrically connected by the connection lines DS1 to DS3 and GS1 to GS3, are cut at this cutting step along the cutting lines GCUT1 to GCUT4 so that the adjoining individual data lines DL and individual gate lines GL are electrically isolated and separated.

<<Seal Shapes of TFT Substrate TFTSUB and Opposed Substrate OPSUB>>

Figure 11A:
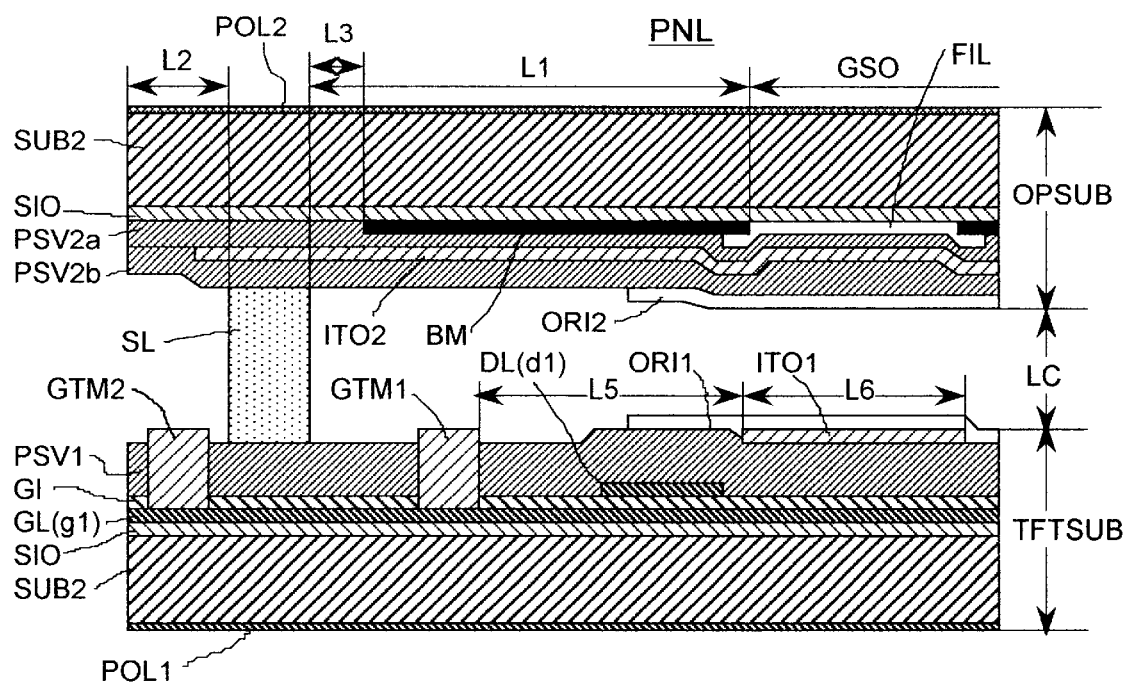
FIGS. 11(a) and 11(b) are diagrams for explaining a construction of the end portions of a TFT substrate and an opposed substrate adhered through a seal material, and a substrate crack to occur in the structure.

The TFT substrate TFTSUB and opposed substrate OPSUB are adhered with a resin seal material to oppose each other through a predetermined gap, and their peripheries are cut off by the cutting step mentioned before. Throughout these steps, the liquid crystal display panel PNL shown in FIGS. 3 is completed. The cross sectional structure of the end portion of the adhered substrates is shown in FIG. 11(a) on the side of the gate line GL, as having no gate terminal GTCP. FIG. 11(a) shows the structure after the cutting step. The components, as shown, are common to those shown in FIG. 1 (by designating them by the common reference letters), but the following components are added to FIG. 11(a).

A reference character SL denotes the aforementioned seal material which is made of an epoxy resin or made by adding a titanium oxide thereto. On the side of the opposed substrate OPSUB, the passivation film is divided into two layers PSV2a and PSV2b to sandwich the counter electrode ITO2 for applying a potential difference to the liquid crystal layer LC together with the pixel electrode ITO1 mounted over the TFT substrate TFTSUB. In contrast to each of the pixel electrodes having a potential changed by individual video data, the counter electrode ITO2 is set within a predetermined voltage range regardless with the pixel. Therefore, the counter electrode ITO2 is usually formed so as to extend from the right side of FIG. 11(a) to the end of the substrate. In order to prevent the excess charge from being stored in the counter electrode ITO2, the counter electrode is connected through the conductor (not-shown) disposed in the seal material SL with an external circuit (or a grounded circuit) formed on the side of the TFT substrate TFTSUB. The passivation film PSV2b is intended to protect the counter electrode ITO2 and to fix the seal material SL. A reference character SIO denotes a film for improving the adhesiveness between the substrate and either the gate line GL (on the SUB1 side) formed on the surface of the substrate, the shielding film BM or the color filter FIL (on the SUB side), and is made of a silicon oxide ($SiO_2$). The components GTM1 and GTM2 will be described hereinafter.

Ignoring the components GTM1 and GTM2 in FIG. 11(a), so-called "dead space" appears in the periphery of the seal material SL. For example, the distance L1 from the end portion of the display region GSO (defined as the closest "edge" of the opening of the shielding film to each of substrate ends) to the inner wall of the seal material (i.e., the face contacting the liquid crystal layer, on the right side in FIG. 11 (a)) is set larger than 2 mm. Moreover, the distance L2 from the substrate end to the outer wall (on the left side in FIG. 11(a)) of the seal material is also set at about 0.4 mm. Correspondingly, the aforementioned dead space is formed over the TFT substrate TFTSUB.

The distance L1 of 2 mm or more in FIG. 11(a) is important for retaining the registration accuracy in a mounting stage of the liquid crystal display panel PNL with a frame FR (see FIG. 4) which covers the periphery of the upper surface of the substrate SUB2. Furthermore, it is preferable to dispose the end of the shielding film BM (or its own outer periphery) so as to oppose the "space" enclosed by the aforementioned seal material SL for holding the liquid crystal layer LC. Thus, it is recommended that the shielding film BM does not extend over the seal material SL to the substrate end.

In the case of the shielding film BM made of a resin material, a problem occurs that the end of the shielding film is stripped during the substrate cutting step and light leaks therethrough. This problem seems to be caused by the difference of adhesiveness between the shielding film and its peripheral component. In FIG. 11(a), the $SiO_2$ film SIO is formed to fix the shielding film BM stably on the substrate SUB2. However, the adhesion strength between the shielding film BM and the $SiO_2$ film is inferior to that between the shielding film BM and the passivation film PSV2a over the former (the expression inverted from the arrangement of FIG. 11(a), because it refers to the substrate SUB2). Moreover, the adhesion strength between the shielding film BM and the passivation film PSV2a is inferior to that between the seal material SL and the passivation film PSV2b. As a result, the adhered portion between the shielding film EM and the $SiO_2$ film SIO is fragile to the influence of a force applied from the outside by cutting the substrate. Even if a shielding film material such as Cr which is excellent in the adhesiveness is adopted, the possibility for the shielding film BM to be stripped from the upper face of the substrate SUB2 (or an overlying layer) cannot be eliminated because of the consideration for the conditions specified by the aforementioned adhesiveness strength.

Against this problem, it is recommended to confine the shielding film BM in the plane enclosed by the seal material of the substrate SUB2, as shown in FIG. 11(a), so that the end portion of the shielding film BM does not reach the seal material SL. As a specific example, it is desirable to retain a distance L3 of 0.2 mm or more between the inner face (as contacting with the liquid crystal layer, as located on the right side of FIG. 11(a)) of the seal material and the shielding film end portion. Here, the light leaking from the outer periphery of the end portion of the shielding film BM is blocked by the frame FR (see FIG. 4) covering the peripheral edge of the upper face of the substrate SUB2 at the stage of mounting the liquid crystal display device.

Figure 11B:
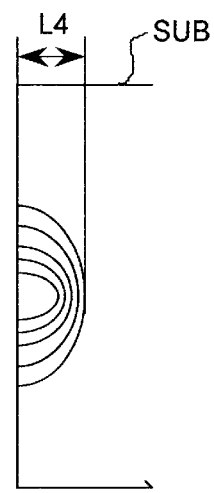

On the other hand, during the step for cutting the glass substrate (or the aforementioned mother glass) to separate it into the individual liquid crystal display substrates, the cracks may extend from the cut portions, as shown in FIG. 11(b). FIG. 11(b) presents a sketch of cracks as seen from a planar direction at one of the ends of the substrates SUB1 and SUB2 from the left side of FIG. 11(a). A recess having a pattern of the shell of a bivalve is formed in the substrate face. When this recess reaches the connection between the TFT substrate or the opposite substrate and the seal material SL, therefore, the liquid crystal composite leaks from the liquid crystal layer. A distance L4 of the cracks of the recess as shown in FIG. 11(b) may be about 0.2 mm on an average or may reach as large as 0.3 mm. In view of this situation, even at the substrate end which is not used for connecting the circuit in the liquid crystal display substrate and its external circuit, the distance L2 between the end portions of the substrates SUB1 and SUB2 and the seal material SL is set at least 0.3 mm, e.g., 0.35 mm or more, and may desirably be set 0.4 mm or more.

Considering the area of the dead space inevitably formed around the display region GSO and the shape of the aforementioned inspection probe, the inspection terminal GTM of the invention may be positioned, as shown in FIG. 11(a), either between the outer periphery of the display region GSO and the seal material (GTM1), or between the outer side of the seal material SL and the substrate end portion (GTM2). In the former position, if the inspection terminal GTM1 interferes with the electric field of its closest pixel electrode ITO1 at the time of driving the liquid crystal display device, it is recommended to set the distance L5 separating the inspection terminal GTM1 and the pixel electrode larger than the length (along the gate lines, in this case) L6 of the pixel electrode. The discussion can be applied to the inspection terminal of the data lines. In the case of the data lines, the length L6 of the pixel electrode is defined as the length along the "data lines", with which the inspection terminal under consideration is connected.

Fabrication Method of TFT Substrate TFTSUB

The disconnecting inspection terminal in this embodiment has further advantage in its fabrication process. Most of all steps for its fabrication can be done together with those for the thin film transistor TFT. A process for fabricating the TFT substrate TFTSUB of the liquid crystal display panel PNL will be described with reference to FIG. 12 and FIGS. 13 to 23.

Figure 12:
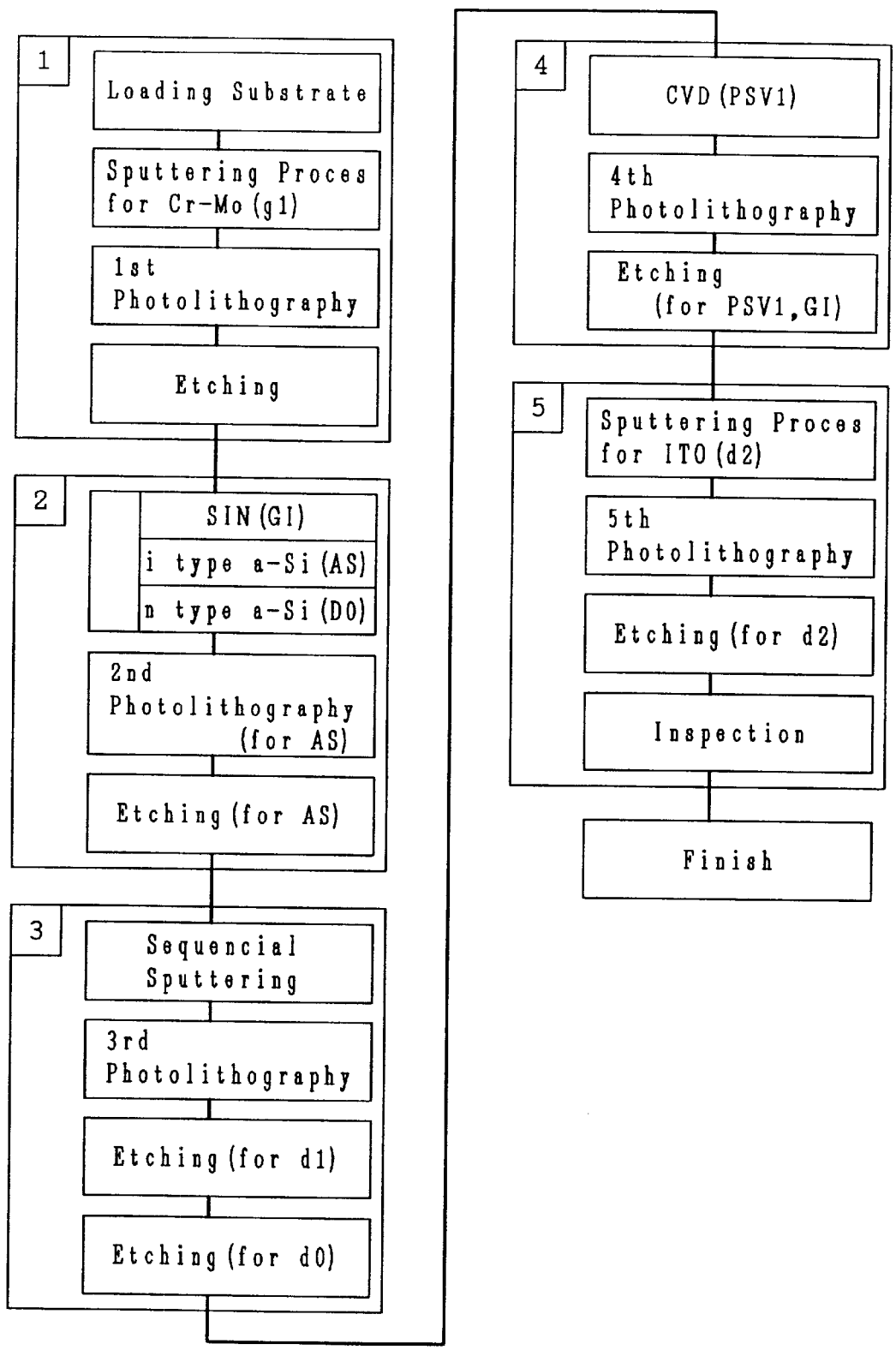
FIG. 12 is a flow chart arranging the flow of a process for fabricating the TFT substrate TFTSUB into Steps 1 to 5.

FIG. 12 is a flow chart showing the flow of a process for fabricating the TFT substrate TFTSUB into Steps 1 to 5. FIGS. 13 to 23 are cross sections showing constructions corresponding to the Steps 1 to 5 of FIG. 12.

FIGS. 13 to 18 are cross sections taken along line 1A—1A of FIG. 2 (related to the TFT substrate of FIG. 1). Specifically, these cross sections are taken from the intersection of the gate line GL and the data line DL of the TFT substrate TFTSUB, across the pixel electrode ITO1, and then across the gate line GL.

FIGS. 19(a), 20(a), 21(a), 22(a), and 23(a) are cross sections corresponding to FIG. 5(a), and taken along the line 5A—5A in FIG. 5(c). FIGS. 19(b), 20(b), 21(b), 22(b), and 23(b) are cross sections corresponding to FIG. 5(b), and taken along the section along the line 5B—5B of FIG. 5(c). Specifically, the former group of FIGS. 19(a) to 23(a) shows cross sections taken along the data line DL containing the drain inspection terminal DTM at Steps 1 to 5 of FIG. 12. The latter group of FIGS. 19(b) to 23(b) shows cross sections taken along the gate line GL containing the gate inspection terminal GTM at Steps 1 to 5 of FIG. 12.

Step 1

As shown in FIG. 12, the transparent glass substrate SUB1 is loaded at first, and an alloy film of Cr and Mo is sputtered on one surface (on the side of the liquid crystal layer) of the transparent glass substrate SUB1 so as to form the gate lines GL.

Next, the alloy film is subjected to a photolithography treatment (referred to the "photo treatment" hereinafter, and "first photo" in this step) to form a mask film (e.g., a photoresist film, as in the following) of a predetermined pattern.

Figure 13:
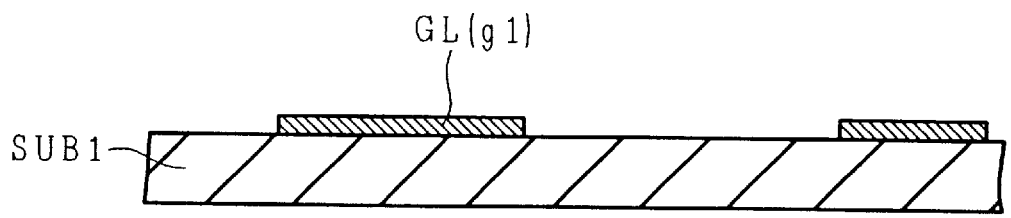
FIG. 13 is a section of Step 1 of FIG. 12, as corresponding to the section of FIG. 2 along the line 1A—1A.

Thereafter, the alloy film is selectively etched to form the conductor film g1 of a predetermined pattern (as shown in FIGS. 13, 19(*a*), and 19(*b*)). In this example, the wet etching treatment was performed by using a solution of ammonium ceric nitrate of a concentration of about 15 wt. % as the wet etching solution.

Step 2

Next, over the transparent glass substrate SUB1 having the conductor film g1, there are sequentially formed a silicon nitride film (SiN film) G1, the i-type amorphous Si semiconductor conductor layer AS and the n-type amorphous Si semiconductor layer d0, for example, by the plasma CVD method.

Next, the mask film is formed by the photo treatment (or the second photo).

Figure 14:
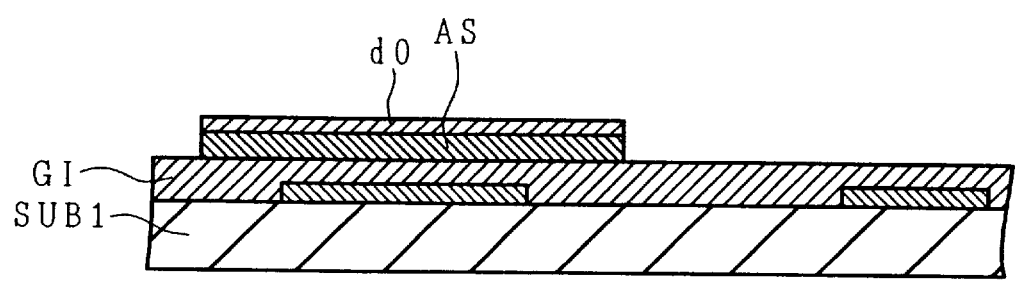
FIG. 14 is a section of Step 2 of FIG. 12, as corresponding to the section of FIG. 2 along the line 1A—1A.

After the second photo treatment, a mixture gas of sulfur hexafluoride ($SF_6$) and hydrogen chloride (HCl) is used to etch off the n-type amorphous Si semiconductor layer do and the i-type amorphous Si semiconductor layer AS to form a predetermined pattern (as shown in FIGS. 14, 20(*a*), and 20(*b*)). At this Step, there are formed the channel portion of the thin film transistor TFT, the intersections between the gate lines GL and the data lines DL, and their peripheral portions (as shown in FIG. 2). This etching treatment is continued for a while after the surface of the Si nitride film GI was exposed, so as to leave no residual of the i-type amorphous Si semiconductor layer AS, so that the surface of the Si nitride film GI is etched although slightly.

Step 3

Over the transparent glass substrate SUB1, there is formed the alloy film of Cr and Mo by the sputtering method so as to form the data lines DL (or the drain electrodes) (including portions of the data lines DL connecting with the drain terminals DTCP and the drain inspection terminals DTM). Alternatively, the alloy film of the Cr film and CrMo and the Cr film may be laminated.

Next, a mask film is formed over the alloy film by the photo treatment (or the third photo).

Figure 15:
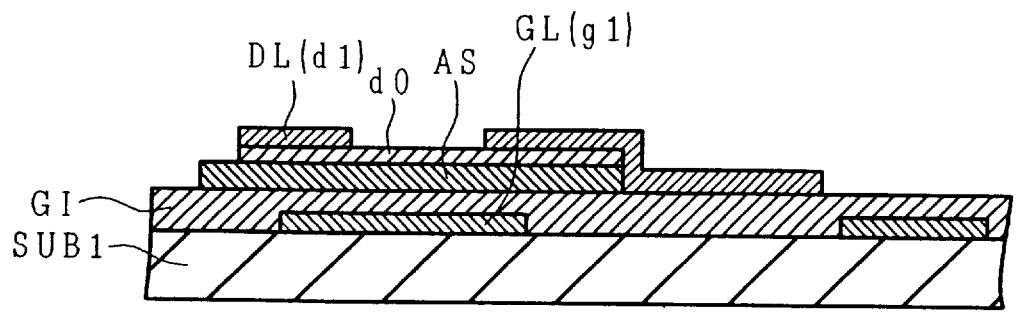
FIG. 15 is a section of Step 3 of FIG. 12, as corresponding to the section of FIG. 2 along the line 1A—1A.

After the third photo treatment, the alloy film is selectively etched to form a predetermined pattern (as shown in FIGS. 15, 21(*a*), and 21(*b*)). By this step, the conductor film d1 for constructing the data line DL, the drain terminal DTCP, the drain inspection terminals DTM and the source electrode SD1 is formed into a predetermined shape.

Figure 16:
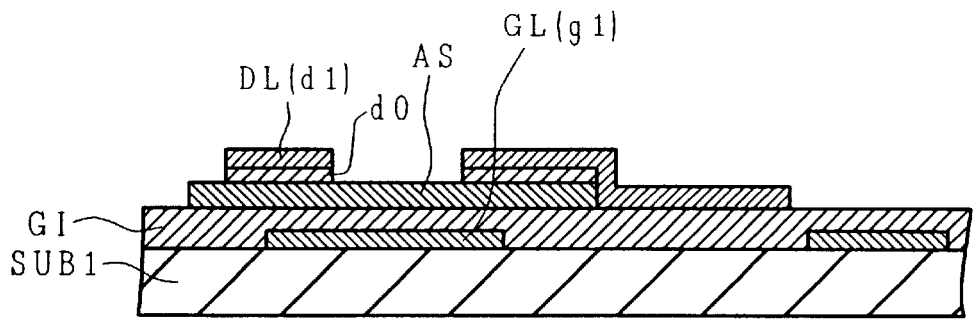
FIG. 16 is a section of Step 3 of FIG. 12, as corresponding to the section of FIG. 2 along the line 1A—1A.

By using the mask film of the conductor film d1 formed at the foregoing step, the n-type amorphous Si semiconductor layer d0 is selectively dry-etched off (as shown in FIG. 16) by using a mixture gas of $SF_6$ and $BCl_3$ (boron trichloride). The n-type amorphous Si semiconductor layer d0 lying on the i-type amorphous Si semiconductor layer AS is separated for two side corresponding to source and drain electrodes of the thin film transistor.

Step 4

Next, a Si nitride film for the passivation film PSV1 is formed over the transparent glass substrate SUB1. The film thus formed has a thickness of about 2,000 to 6,000 Å, as exemplified by 3,000 Å in this example.

Next, a mask film is formed over the Si nitride film by the photo treatment (or the fourth photo). In this photo treatment, it is recommended to use a photo mask disposed in the photolithography apparatus having a pattern related to at least two kinds of contact holes. One of the contact holes is to connect an electrode of each thin film transistor and a pixel electrode corresponding thereto. Another of the contact holes is to connect at least one of the data line and the gate line and an inspection terminal corresponding thereto.

Figure 17:
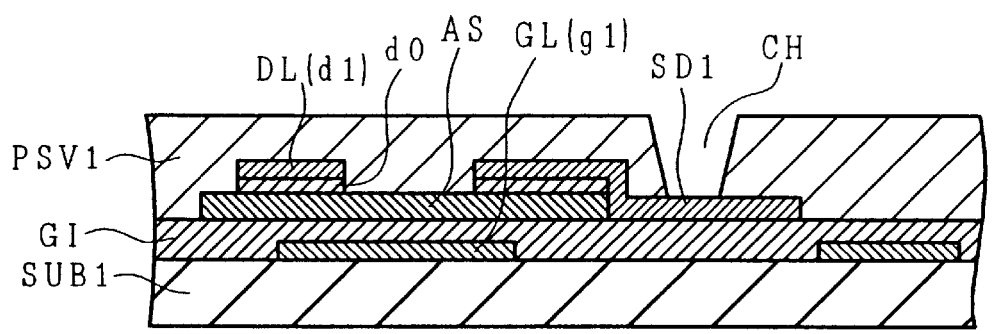
FIG. 17 is a section of Step 4 of FIG. 12, as corresponding to the section of FIG. 2 along the line 1A—1A.

After this photo treatment, the Si nitride film is etched by a mixture gas of $SF_6$ and oxygen. By this step, the passivation film PSV1 is removed from over a contact hole CH to be connected with the source electrode SD1, the drain terminal DTM, the drain inspection terminal DTM, the gate terminal GTM and the gate inspection terminal GTM (as shown in FIGS. 17, 22(*a*), and 22(*b*)).

Step 5

Next, the conductor film d2 of the ITO film is formed over the transparent glass substrate SUB1 by the sputtering method.

Next, a mask film is formed by the photo treatment (or the fifth photo). In this photo treatment, it is recommended to use the other photo mask having a pattern related to both the pixel electrode disposed in the aforementioned display region GSO and the inspection terminal disposed in a periphery of the display region.

Figure 18:
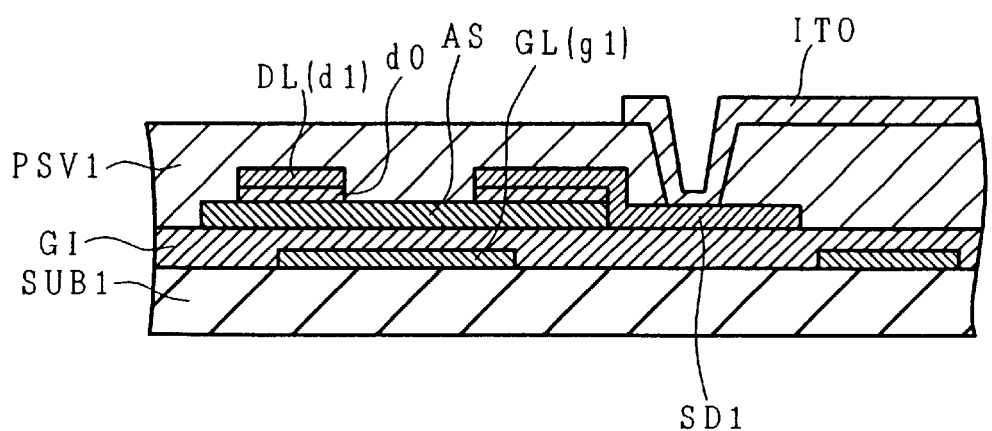
FIG. 18 is a section of Step 5 of FIG. 12, as corresponding to the section of FIG. 2 along the line 1A—1A.
Figure 19A:
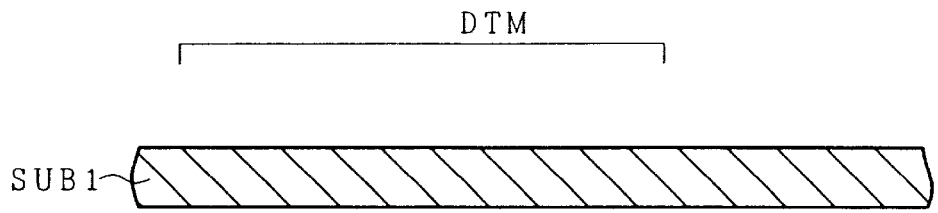
FIG. 19(a) is a section of Step 1 of FIG. 12, as corresponding to the section of FIG. 5(c) along the line 5A—5A.
Figure 19B:
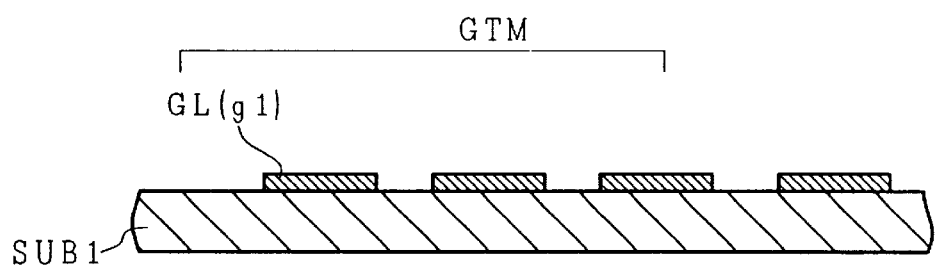
FIG. 19(b) is a section corresponding to the section along the line 5B—5B.
Figure 20A:
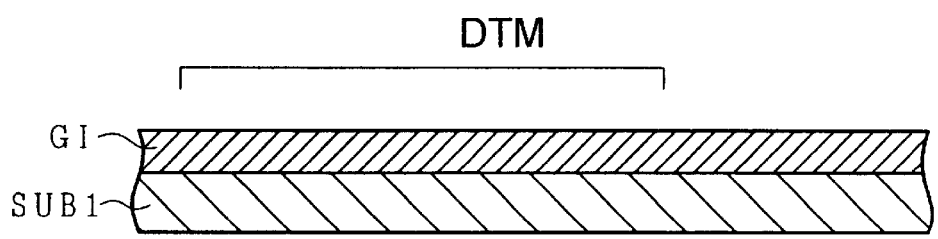
FIG. 20(a) is a section of Step 2 of FIG. 12, as corresponding to the section of FIG. 5(c) along the line 5A—5A.
Figure 20B:
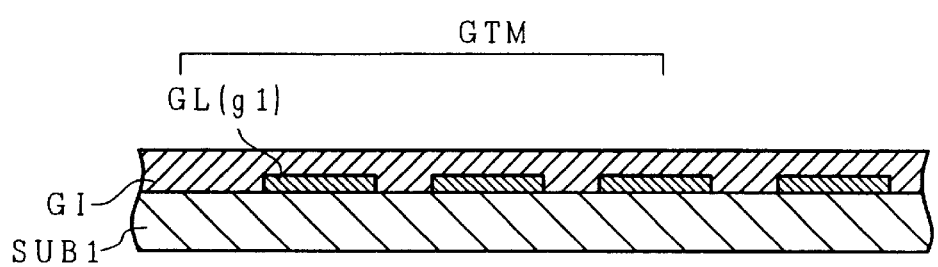
FIG. 20(b) is a section corresponding to the section along the line 5B—5B.
Figure 21A:
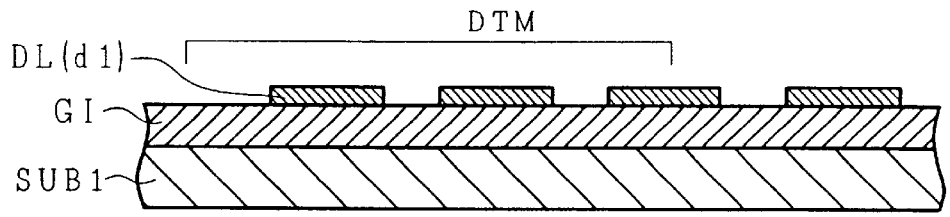
FIG. 21(a) is a section of Step 3 of FIG. 12, as corresponding to the section of FIG. 5(c) along the line 5A—5A.
Figure 21B:
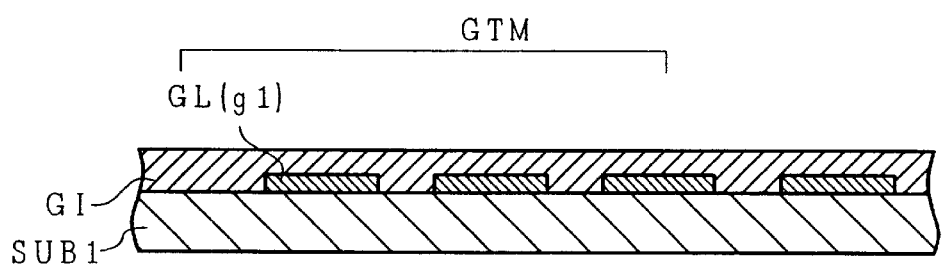
FIG. 21(b) is a section corresponding to the section along the line 5B—5B.
Figure 22A:
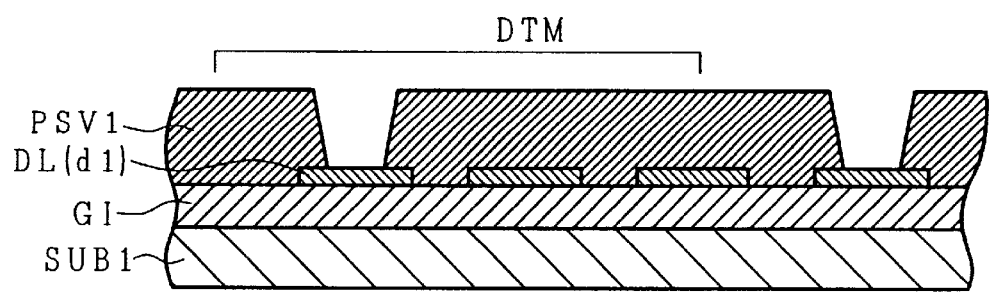
FIG. 22(a) is a section of Step 4 of FIG. 12, as corresponding to the section of FIG. 5(c) along the line 5A—5A.
Figure 22B:
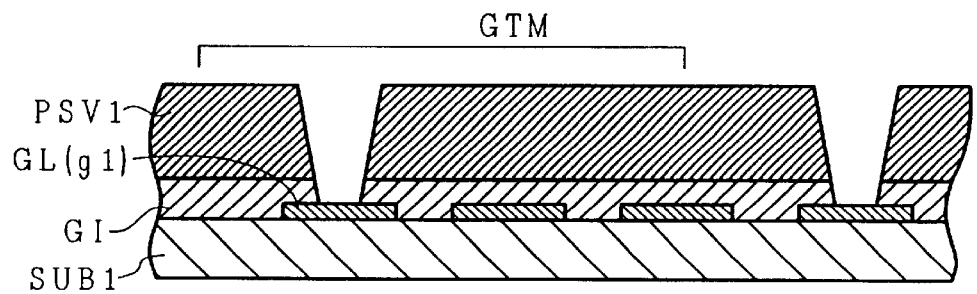
FIG. 22(b) is a section corresponding to the section along the line 5B—5B.
Figure 23A:
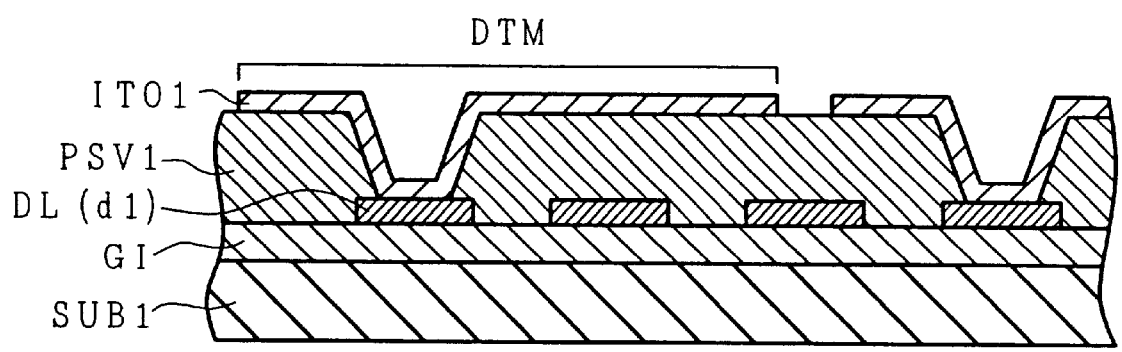
FIG. 23(a) is a section of Step 5 of FIG. 12, as corresponding to the section of FIG. 5(c) along the line 5A—5A.
Figure 23B:
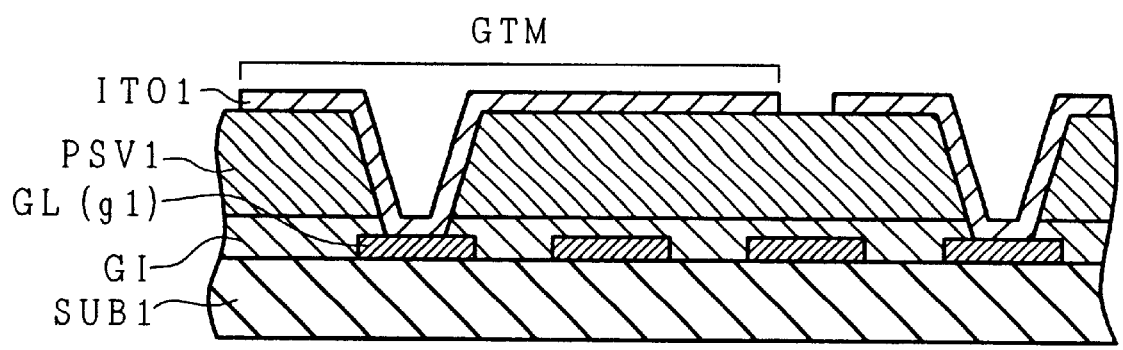
FIG. 23(b) is a section corresponding to the section along the line 5B—5B.

After this photo treatment, the conductor film d2 is selectively etched with a solution of HBr (hydrogen bromide) to form the pixel electrode ITO1 (as shown in FIGS. 18, 23(*a*) and 23(*b*)). At this time, the upper surfaces of the metal films of the contact hole CH of the pixel portion, the gate terminal GTCP, the gate inspection terminal GTM, the drain terminal DTCP and the drain inspection terminal DTM exposed in the step 4 respectively, are coated with the conductor film d2 (or the ITO film). The conductor films d2 formed in the gate and drain terminals GTCP, DTCP not only transmit the voltage signal from the drive IC connected with the conductor film d2 to the gate lines GL and the data lines DL respectively, but protect these metal film from chemical reactions like a corrosion or mechanical damage.

Consequently, the steps of laminating the various films of the TFT substrate TFTSUB are completed. As mentioned above, the inspection terminals can be formed in the steps 4 and 5 together with the pixel electrodes without any additional process. Especially, using at least one of the photo masks recommended in the steps 4 and 5, the inspection terminals can be reproduced so accurately that such problems as the probe damage and the misalignment in the disconnecting inspection are reduced drastically.

Embodiment 2

Figure 24:
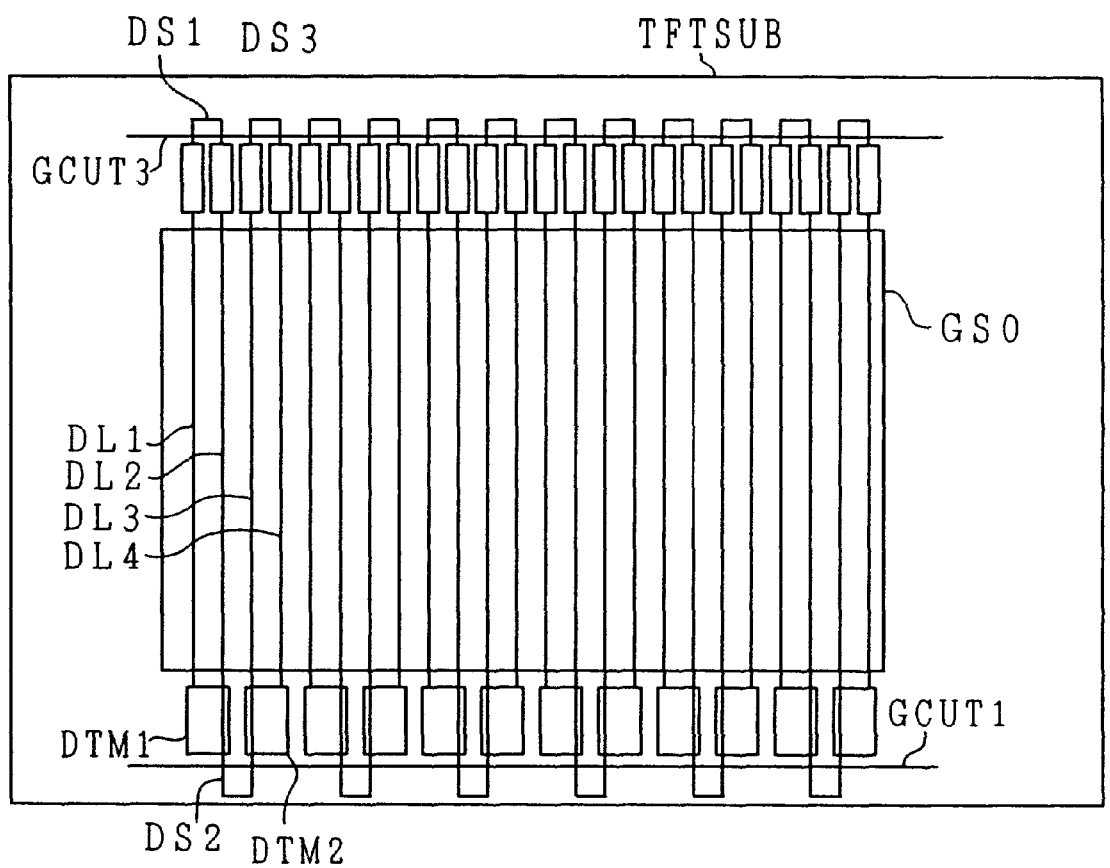
FIG. 24 is a view showing only the data line DL portion of the schematic top plan view of a TFT substrate TFTSUB of Embodiment 2 of the invention before a cutting step.

Embodiment 2 of the invention will be described with reference to FIG. 24 which is similar to FIG. 6 of Embodiment 1, and shows a schematic section of the TFT substrate TFTSUB before the cutting step and only a portion of the data lines DL. In this embodiment, the TCP type drive IC is used as in the case of Embodiment 1.

The process for fabricating the TFT substrate TFTSUB is similar to that of Embodiment 1 except for the following three points. These points are: (1) the common short-circuiting line (i.e., DCL of FIG. 6), the inspection terminal (DCT) and the connection line DS3 are eliminated; (2) four data lines DL1, DL2, DL3 and DL4 belong to one set and are electrically connected through the connection lines DS1 and DS2 so that they are inspected; and (3) the function of the inspection terminal DCT in Embodiment 1 is performed by the inspection terminal DTM2.

In this Embodiment, the area of the portion, in which the common short-circuiting line (DCL of FIG. 6 of Embodiment 1) is arranged, can be eliminated to provide a larger display region GSO.

In the TCP type liquid crystal display device thus far described, Embodiment 1 has been described with respect to the method for inspecting three data lines DL at one time, and Embodiment 2 provides for inspecting four data lines DL at one time. In other words, Embodiment 1 can inspect an odd number of data lines DL simultaneously, and Embodiment 2 can inspect an even number of data lines DL simultaneously. This means that Embodiment 2 can further augment the area of the inspection terminals DTM. It is apparent that the number of lines to be inspected all at one time could be further enlarged.

In Embodiment 2, the gate line GL can be also inspected on their disconnections as in Embodiment 1 by providing the gate inspection terminal GTM, the connection lines GS1 to GS3, the gate line common short-circuiting line GCL and the inspection terminal GCT, as shown in FIG. 5(c).

Embodiment 3

Figure 25:
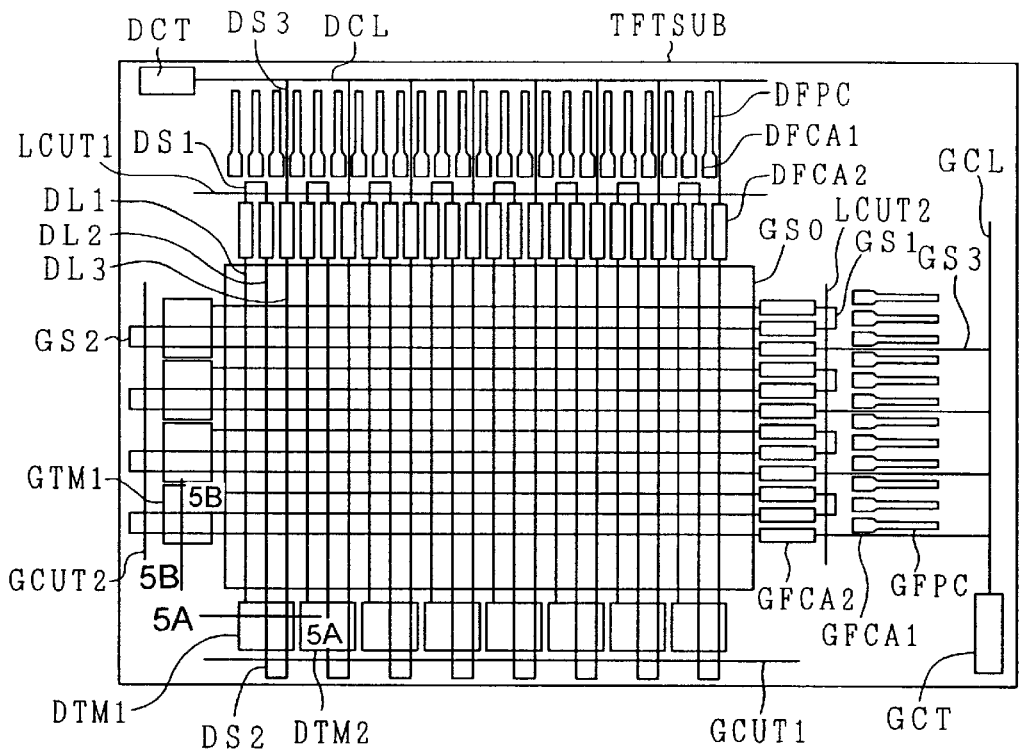
FIG. 25 is a schematic top plan view showing a TFT substrate TFTSUB of the FCA type of Embodiment 3 of the invention before a cutting step.
Figure 26:
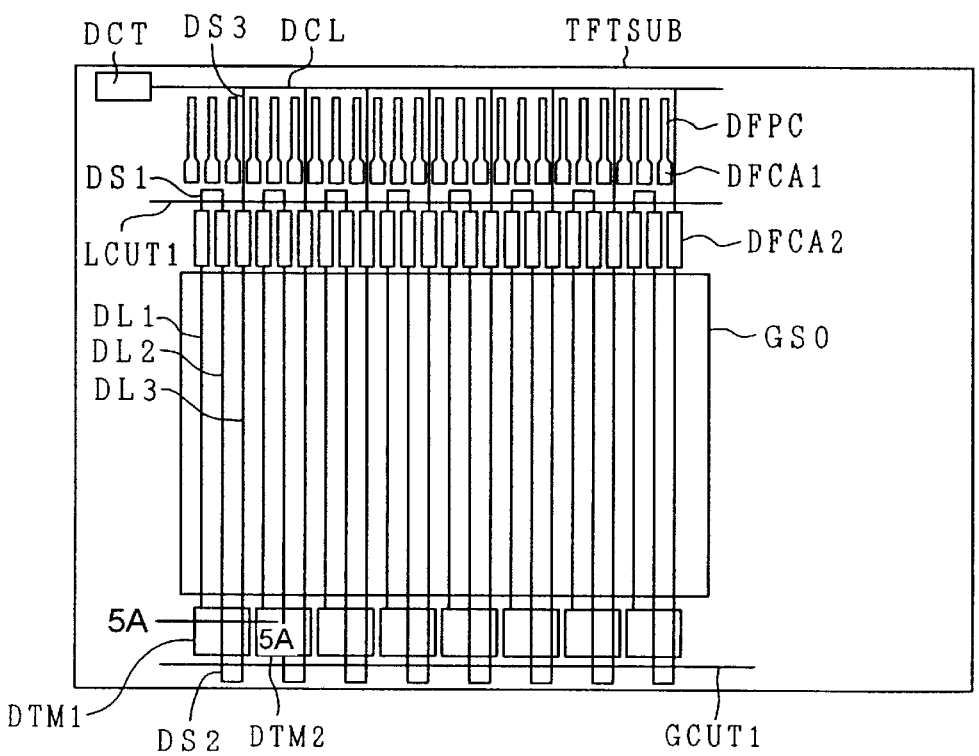
FIG. 26 is a view showing only the data line DL portion of the schematic top plan view of a TFT substrate TFTSUB of Embodiment 3 of the invention before a cutting step.

The foregoing Embodiments 1 and 2 are directed to the liquid crystal display devices using the TCP type driver IC, but Embodiment 3 uses an FCA (Flip Chip Attachment) type driver IC and is described with reference to FIGS. 25–27. The process for fabricating the TFT substrate TFTSUB and the method of inspecting the disconnections are similar to those of Embodiment 1. FIG. 25 is a schematic plan view of the TFT substrate TFTSUB before the cutting step, and FIG. 26 shows only the data lines DL in FIG. 25. In other words, FIG. 25 corresponds to FIG. 5(a) of Embodiment 1, and FIG. 26 corresponds to FIG. 6.

A reference character DFCA1 denotes a terminal to be connected with the input terminal of the driver IC chip (not-shown) packaged over the TFT substrate TFTSUB, DFCA2 denotes a terminal to be connected with the output terminal of the drive IC chip, DFPC denotes a terminal to be connected with the FPC (Flexible Printed Circuit) for inputting a signal to the driver IC from the outside, GFCA1 denotes a terminal to be connected with the input terminal of the driver IC chip, DFCA2 denotes a terminal to be connected with the output terminal of the driver IC chip, and DFPC denotes a terminal to be connected with the FPC.

The difference from Embodiment 1 is the method of cutting off the connection lines DS1 and DS3 of the data line DL and the connection lines GS1 and GS3 of the gate line GL. In this Embodiment, the connection lines DS1 and DS3, and GS1 and GS3 are cut along cutting lines LCUT1 and LCUT2 with a laser beam at a step different from the cutting step of the glass substrate to cut off the connection lines DS2 and GS2 along the cutting lines GCUT1 and GCUT2. The cutting lines LCUT1 and LCUT2 can be arranged under the mounting portion of the driver IC (not-shown) to make the product contour smaller than that of the TCP type. As exemplified by this Embodiment, it is found that the invention is also effective in the FCA type packaged liquid crystal display device.

<<Connection Mode with External Circuit of Data Lines>>

Figure 27A:
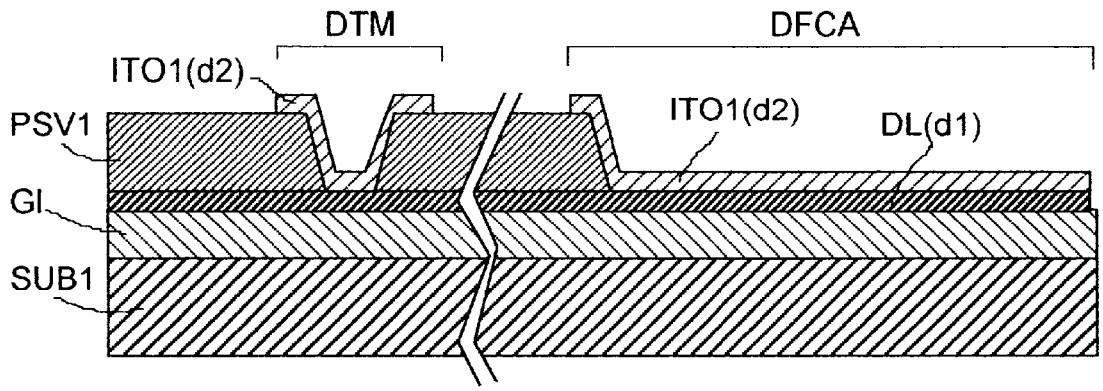
FIGS. 27(*a*) to 27(*c*) are diagrams showing a structure of a connection terminal, as formed in the liquid crystal display substrate, with an external circuit.
Figure 27B:
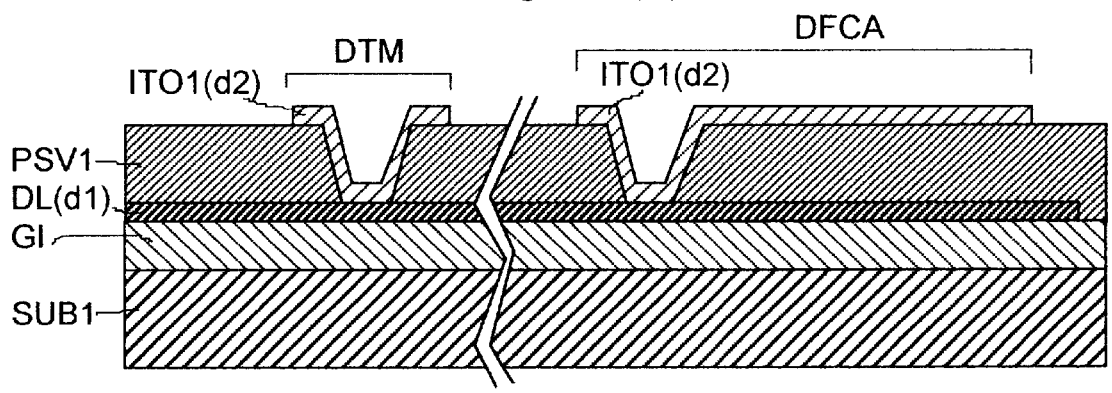
Figure 27C:
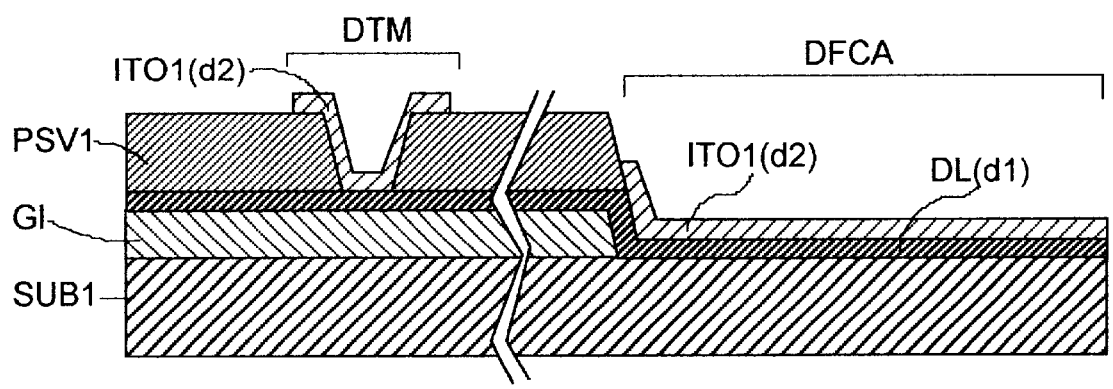

Exemplifying possible structures for the terminal DFCA in this embodiment, the structure of the terminal connecting the data lines and the external circuit is mentioned with reference to FIGS. 27(a) to 27(c) here. The following considerations are not limited to this embodiment, but includes those of Embodiments 1 and 2. Each of FIGS. 27(a) to 27(c) shows the inspection terminal DTN (on the left side) and the connection terminal DFCA (on the right side) of the external circuit opposed to one another across the display region, and the details of the display region are omitted. Each right edge of FIGS. 27(a) to 27(c) shows an edge appearing by the cutting step mentioned in Embodiment 1, at which each of the data line DL extending a periphery of the substrate is cut off.

The terminal structure to be realized by using the process described in Embodiment 1 is shown in FIGS. 27(a) and 27(b). In the construction of FIG. 27(a), the data line DL is extended to the terminal DFCA. This extension raises an advantage that the resistance from the terminal to the drain electrode of the TFT can be lowered.

In FIG. 27(b), on the contrary, the terminal is formed by extracting the circuit (lead line) from the data line DL (e.g. made of a refractory metal) onto the passivation film PSV1 with the wiring line of the ITO1 formed together with the pixel electrode. This structure may raise the resistance of the data line higher than that of FIG. 27(b) in which the data line DL extends straight. However, it can be expected that the reliability is enhanced because the electric connection with the external circuit is made over the passivation film PSV1 liable to form a flat surface.

Furthermore, the structure of FIG. 27(b) can cut off the disconnection inspecting connection lines GS1, GS3, DS1 and DS3 by the substrate cutting method of Embodiment 1, even in the flip chip attachment package of this Embodiment. First of all, all the terminals DFCA1, GFCA1, DFCA1, GFCA2, DFPC and GFPC of FIG. 25 are formed over the passivation film PSV1. Regarding a row of the terminals DFCA2-DFCA1-DFPC as the conductor film ITO1 in the right side of FIG. 27(b) extending rightward over the passivation film PSV1, the conductor film ITO1 will be separated at one portion corresponding to DFCA2-DFCA1. The same structure as DFCA2-DFCA1-DFPC is also applied to a row of the terminals GFCA2-GFCA1-GFPC. On the other hand, the individual wiring lines DS1, DS3, GS1 and GS3 are extended to or toward the common short-circuiting lines DCL and GCL while not being pulled over the passivation film PSV1 but leaving the data line DL and the gate line GL therebelow. Regarding each of these wiring lines DS1, DS3, GS1, and GS3 as the data line DL in the right side of FIG. 27(b), it is sufficient to extend the data line DL rightward under the passivation film PSV1 beyond the right end of ITO1 of the terminal DFCA. Therefore, the structure of FIG. 27(b) separates both the wiring lines DS1, DS3 from the terminals DFCA2, DFCA1 and DFPC by the passivation film PSV1, and the wiring lines GS1, GS3 from the terminals GFCA2, GFCA1 and GFPC by the gate insulating film GI and the passivation film PSV1 stereoscopically so that these wiring lines can be cut off as easily and thoroughly as Embodiment 1.

As shown in FIG. 27(c), the terminal DFCA is constructed by dropping the data line DL from over the gate insulating film GI to the side of the substrate SUB1. This makes it impossible to use the Step 4 of Embodiment 1 for both the gate oxide film GI and the passivation film PSV. Since the connection terminal with the external circuit is provided on the surface such as the surface of the substrate SUB1, as is warranted to be flat, however, the advantage is that the reliability is high and that the terminal forming position (or height) over the substrate is not changed independently of the filming result.

As to the connection terminal between the external terminal and the data line or the gate line, any of the constructions shown in FIGS. 27(a) to 27(c) may be utilized to embody the invention. The embodiment could be changed depending whether the process or performance is preferred to, and the inspection terminal could be made of a metal material other than the ITO.

Embodiment 4

Figure 28:
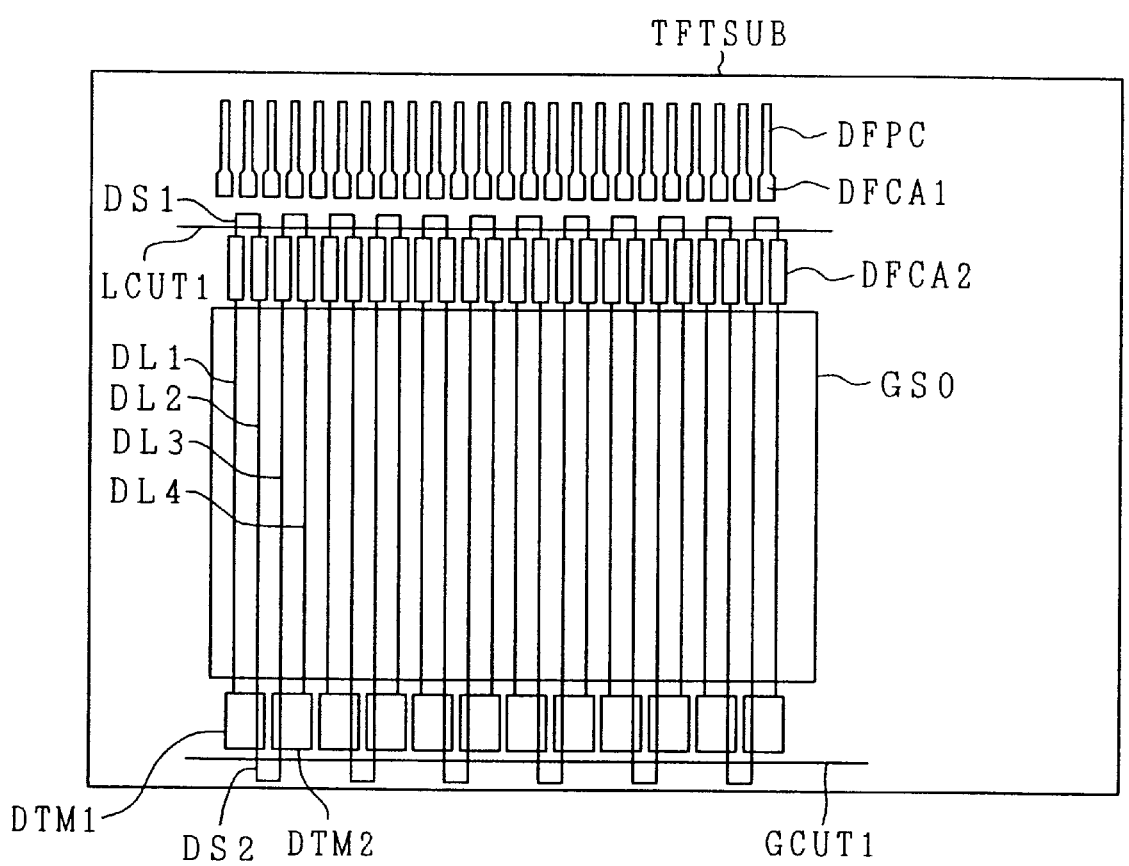
FIG. 28 is a view showing only the data line DL portion of the schematic top plan view of a TFT substrate TFTSUB of the FCA type of Embodiment 4 of the invention before a cutting step.

Embodiment 4 is described with reference to FIG. 28 and the FCA type drive IC is also used. FIG. 28 corresponds to FIG. 24 of Embodiment 2 and shows only the data line DL of the schematic plan view of the TFT substrate TFTSUB before the cutting step.

In this Embodiment, the method of inspecting a set of even number of data lines DL, as embodied in Embodiment 2 (of FIG. 24), all at one time is practiced in the FCA type. The method of cutting the connection lines DS1 and DS2 is similar to that of Embodiment 3. Specifically, the connection line DS2 is cut at the glass cutting along the cutting line GCUT1, and the connection line DS1 is cut long the cutting line LCUT1 with the laser beam. This Embodiment also has the effects to reduce the contour by omitting the common short-circuiting line DCL, as described in Embodiment 2, and to reduce the contour by the FCA method, as described in Embodiment 3.

Although the present invention has been specifically described in connection with Embodiments 1–4, the invention is not limited to the foregoing Embodiments but can apparently be modified in various manners without departing from the gist thereof. For example, the invention is highly effective when applied to the data lines having a pitch as small as one third of that of the gate lines, but could naturally be applied to the gate lines and both the data lines and the gate lines. In the foregoing Embodiments, on the other hand, the substrate TFTSUB is cut along the cutting lines GCUT1 and GCUT2 outside of the inspection terminals DTM and GTM to leave the inspection terminals DTM and GTM. However, the substrate TFTSUB could be cut inside of the inspection terminals DTM and GTM to discard the inspection terminals DTM and GTM.

The invention could be further applied to the data lines or gate lines of the vertical electric field type or lateral electric field type (In-Plane-Switching type) active matrix liquid crystal display device, the FCA type liquid crystal display device, or the band-shaped transparent pixel electrodes of the simple matrix liquid crystal display device.

Figure 29A:
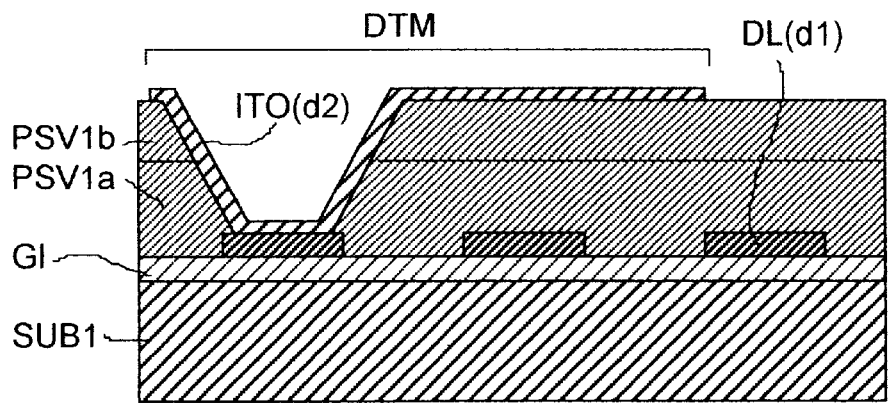
FIGS. 29(*a*) and 29(*b*) are diagrams showing a structure of a data line inspection terminal and a thin film transistor related to the other liquid crystal display substrate of the invention.
Figure 29B:
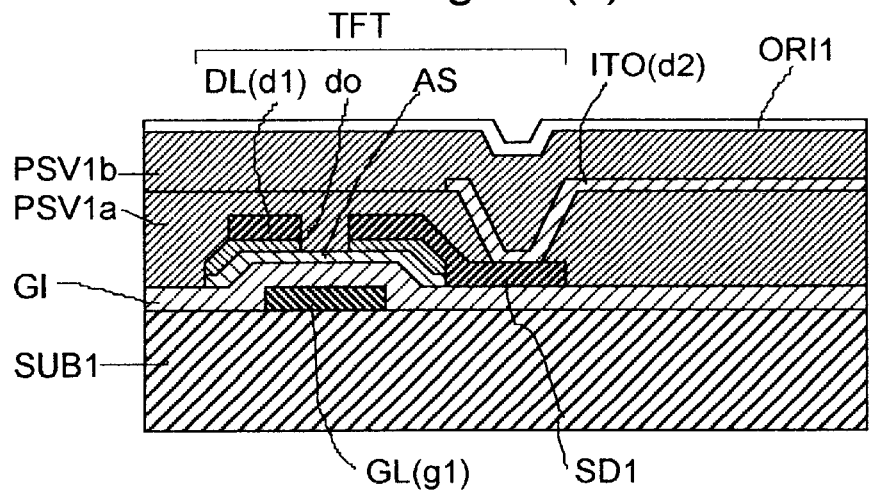

In the foregoing Embodiments, both the inspection terminals and the pixel electrodes are formed over the passivation film PSV1. In order to enhance the flatness of the orientation film to be formed in the display region, the passivation film PSV1 is formed at two separate steps, and the pixel electrode ITO1 may be formed on the substrate side by the inspection terminal ITO1 as shown in FIGS. 29(a) and 29(b).

In the process, the source electrode SD1 of the thin film transistor TFT is exposed by forming the passivation film PSV1a and then by etching it exclusively. Next, the ITO film is formed and etched to pattern the pixel electrodes. Then, the passivation film PSV1b is formed. The interface between the passivation films PSV1a and PSV1b, as shown for illustration purposes, is often unseen even with the electron microscope depending upon the material and the filming condition. The formation of the inspection terminals corresponds to that of Embodiment 1, and the passivation films PSV1a, PSV1b and the gate oxide film GI are etched at the same step to expose the shown data lines DL and the not-shown gate lines.

This construction is effective in case the roughness of the surface of the ITO1 making the pixel electrode raises a problem. The pixel electrode is covered with the passivation film PSV1b to obstruct the static electricity advantageously. Since the pixel electrode and the inspection terminal are formed at the separate steps, moreover, the material for the inspection terminal can be freely selected.

Figure 30:
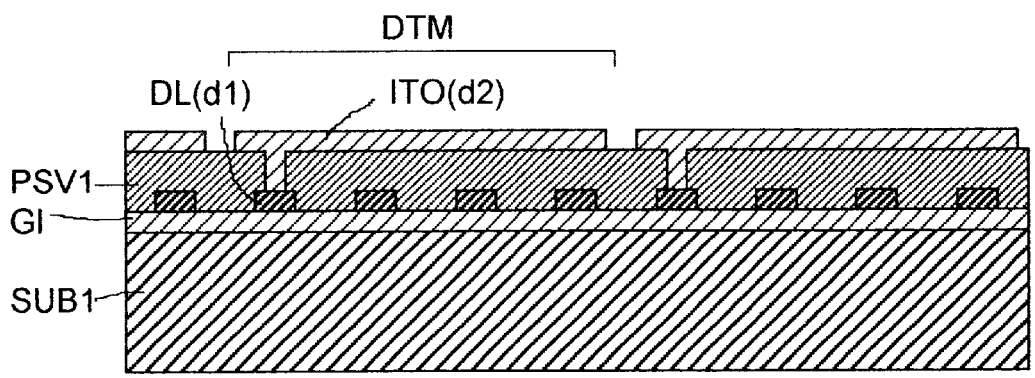
FIG. 30 is a diagram showing a structure of a data line inspection terminal of the liquid crystal display substrate of the invention.

As the definitions of the display region are im-proved as described previously, the width and interval of the data lines become finer. Therefore, the holes formed in the passivation film PSV1 for extracting the inspection terminals from the data lines or the gate lines are also made smaller. Under these circumstances, the invention is practiced with the sectional shape shown in FIG. 30. Although FIG. 30 corresponds to FIG. 5(a), the holes are filled with the conductive material so as to contact the conductive material with the data lines DL exposed in the bottom of the hole to establish conduction with the inspection terminal formed over the passivation film PSV1. A recommended material for the conductive material is polycrystalline silicon used for the contact hole connections of the semiconductor device.

As indicated above, the present invention is applicable to the in-plane switching type active matrix liquid crystal display device (referred to the "IPS type liquid crystal display device"). The liquid crystal display device of this kind is characterized by a component of the electric field applied for controlling the orientation of the liquid crystal composition being substantially parallel to the surface of a substrate. Although the liquid crystal display devices of Embodiments 1 to 4 and the passive matrix liquid crystal display device apply the control electric field between the substrates confronting one another, the liquid crystal display device of this kind applies the control electric field in the direction along the surface of the substrate. According to this feature, the device of this kind is called the "lateral electric field type liquid crystal display device (on the contrary, the devices of Embodiments 1 to 4 are called the "vertical field type liquid crystal display device").

Figure 31A:
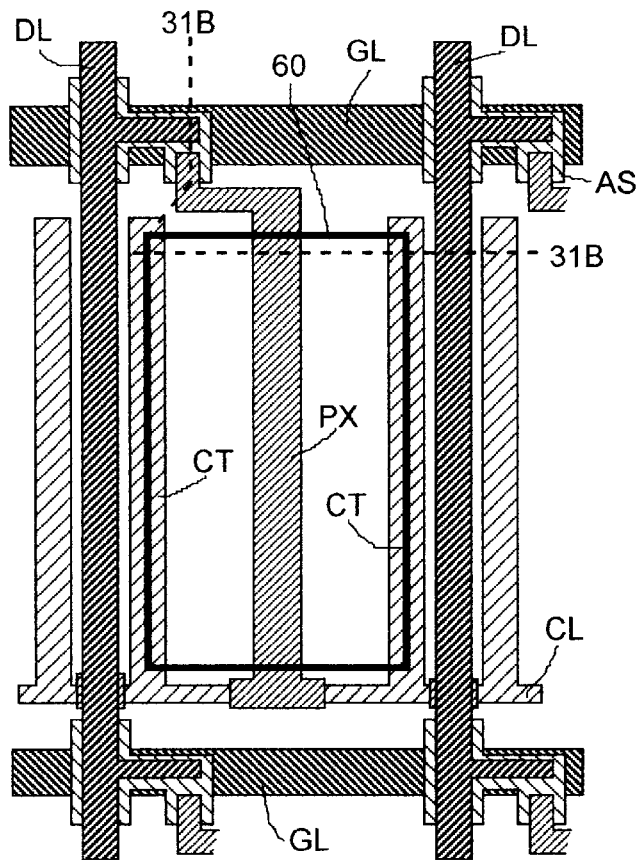
FIGS. 31(*a*) and 31(*b*) are diagrams showing a top plan structure (as viewed from over the substrate) and a cross sectional structure of an in-plane-switching type liquid crystal display device.
Figure 31B:
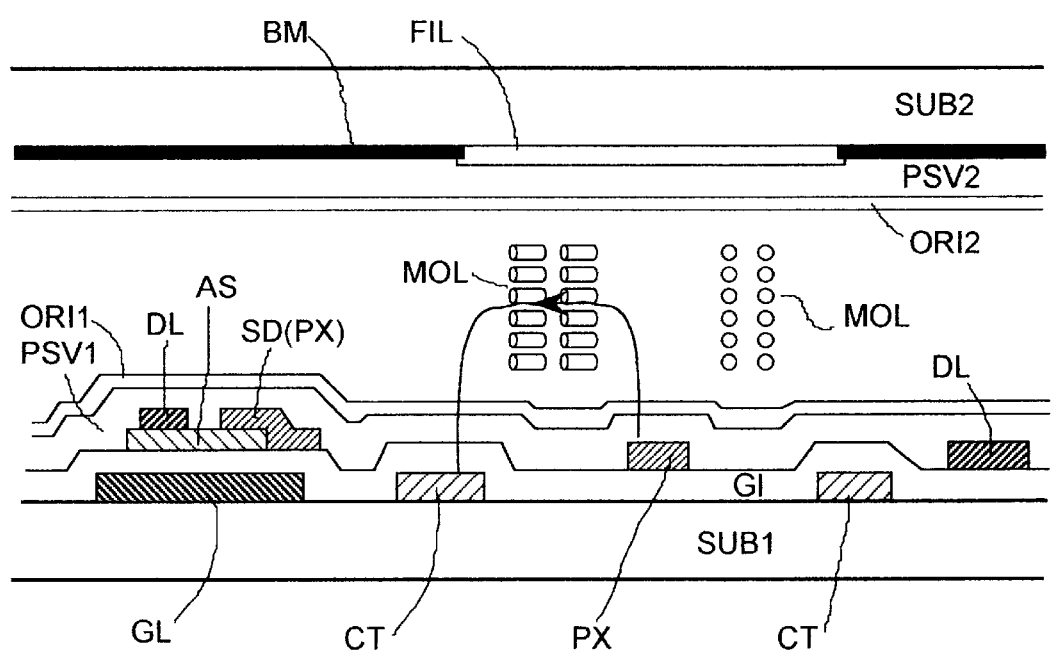

The construction of the general IPS type liquid crystal display device will be described with reference to the top plan view of FIG. 31(a) and the cross section of FIG. 31(b). The top plan view of FIG. 31(a) shows one pixel and the configuration of the wiring lines around the pixel. The constructions, in which the pixel region is enclosed by the two gate lines GL and the two data lines DL and in which a transistor for driving the pixel is formed at one intersection of the gate line and the data line, are common to those of the liquid crystal display device of FIG. 2, except for the following differences.

A pixel electrode PX extending from the source electrode (as in Embodiment 1) of the transistor is not formed all over the pixel region which is delineated by an opening 60 of the shielding film (which is formed at least one of the substrates confronting one another). Therefore, the pixel electrode can also be made of a material for blocking light. Another feature is that a counter electrode CT for establishing an electric field to control the orientation of the liquid crystal composition together with the pixel element PX is formed over the same substrate as that of the pixel electrode. Therefore, it is necessary to provide a wiring line (a counter voltage signal line) CL for applying a predetermined potential to the counter electrode and releasing an excess charge therefrom.

The operational functions of the IPS type liquid crystal display device will be described with reference to the section of FIG. 31(b), which is taken along broken line 31B—31B of FIG. 31(a). In FIG. 31(b), the direction of liquid crystal molecules MOL (the molecular structures of which are illustrated as circular columns), i.e., the "orientation direction of the molecules" are different at the right and left sides of the pixel electrode PX for explanation purposes. In the actual image displaying operations, the right and left liquid crystal molecules MOL are substantially identically oriented around the pixel electrode PX in accordance with the electric field which is applied between the pixel electrode PX and an opposed electrode CT. The molecules in the right side indicate the orientation, in which they are normal to the paper without an electric field applied thereto, whereas the molecules in the left side indicate the orientation under the electric field having the component substantially in parallel to the surface of the substrate as indicated by arrow applied thereto. The conductor film of the ITO or the like is not formed on the main surface of the substrate SUB2, which confronts both the substrate SUB1 having the pixel electrodes and its driving switching elements, and the liquid crystal layer. Among the films formed on the main surface, materials for the shielding film BM and the color filter FIL, which may possibly have the highest specific resistance, are selected so as to make individual specific resistances thereof be equal to or more than $1\times10^6$ Ω·cm. If their individual specific resistances are less than this value, the direction of the electric field shown in FIG. 31(b) may be changed.

Figure 32:
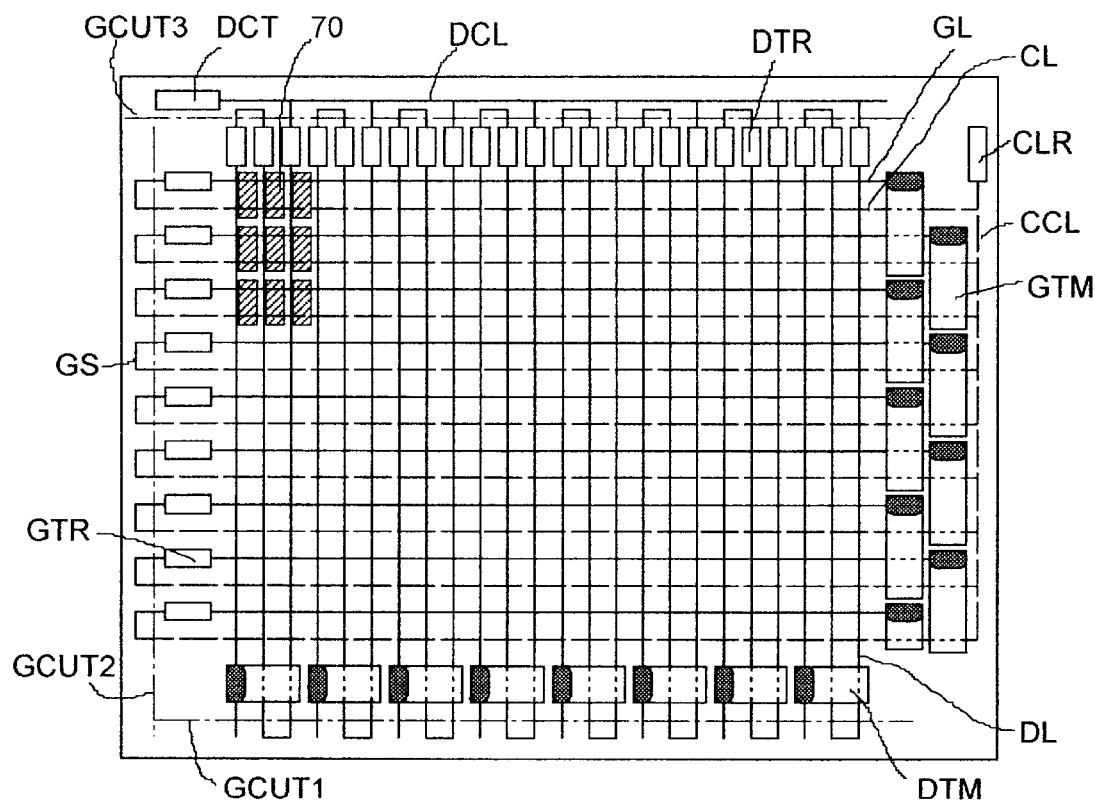
FIG. 32 is a diagram showing an example of application to a substrate for an in-plane-switching type liquid crystal display device.

One example of the application of the invention to the IPS type liquid crystal display device is shown in FIG. 32. Most of the reference characters are explained with reference to FIG. 5(c) and FIG. 6 of Embodiment 1, and it is apparent that the data lines can be practiced in a manner substantially identical to those of Embodiments 1 to 4. In FIG. 32, the connection terminals of the data lines DL and the gate lines GL with the external circuit are denoted by DTR and GTR, respectively, and the portions of the inspection terminals to contact with the data lines DL or the gate lines GL are indicated in black whereas the portions to be formed over the passivation film PSV1 are indicated in white. Here, a hatched region 70 indicates one pixel.

In the execution at the gate line GL, however, it is necessary to consider the presence of the counter voltage signal line CL (indicated by a broken line in FIG. 32) which is extended along the gate line GL referred to in the description of FIG. 31(a) while pairing in a common plane. In order to eliminate any dispersion in gradation among respective rows of the pixels arranged along the gate lines due to the potential difference for the respective counter voltage signal lines CL, these counter voltage signal lines are connected with a common wiring line ("common counter voltage line") CCL so that they are fed the potential by a terminal CLR provided at the common wiring line CCL. Therefore, forming the wiring lines to connect the plurality of gate lines at the disconnecting inspection, they never fail to hit the counter voltage signal line CL and are connected with the common counter voltage line CCL.

In the construction of FIG. 32, the disconnection inspections are performed by providing the connection terminal GTR of the gate line GL with the external circuit on the opposite side of the display region to the common counter voltage line CCL, by wiring each gate line and its corresponding counter voltage signal line CL in series, and by bringing the probe into contact with the inspection terminal GTM and the terminal CLR. In FIG. 32, the gate line inspection terminals GTM are shifted for each gate line, but may be arrayed in a row if this configuration provide sufficient area for a part of the inspection terminal formed over passivation film PSV1 (blank shown in GTM).

Figure 33A:
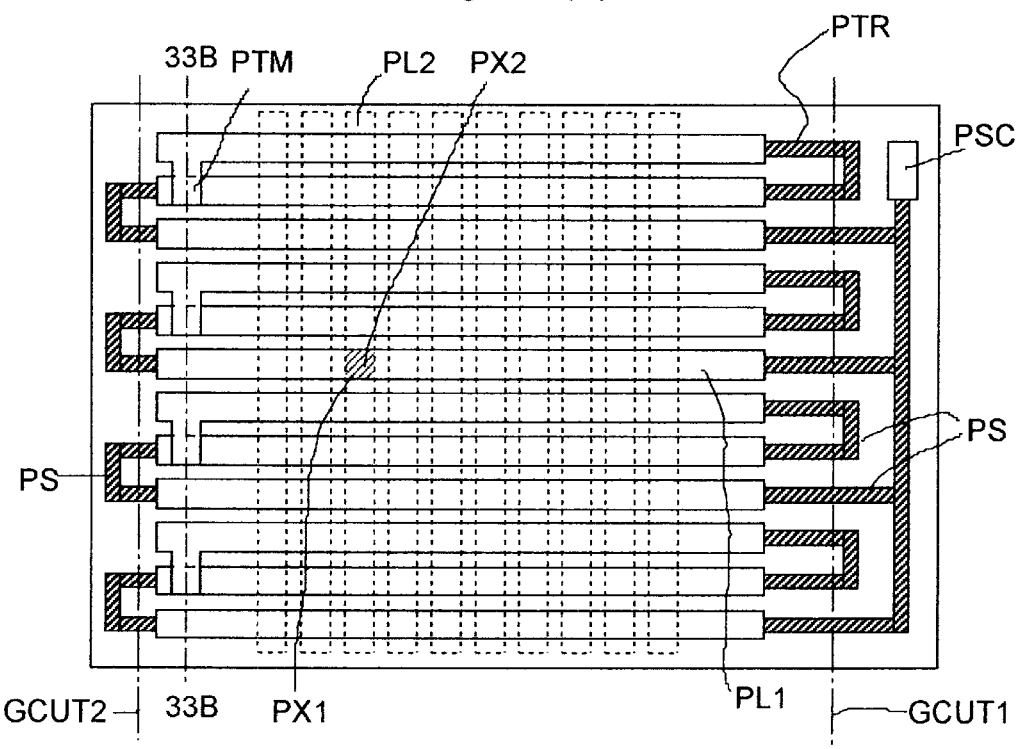
FIGS. 33(*a*) and 33(*b*) are a top plan view and a cross section showing an example of application to a substrate for a passive matrix type liquid crystal display device.
Figure 33B:
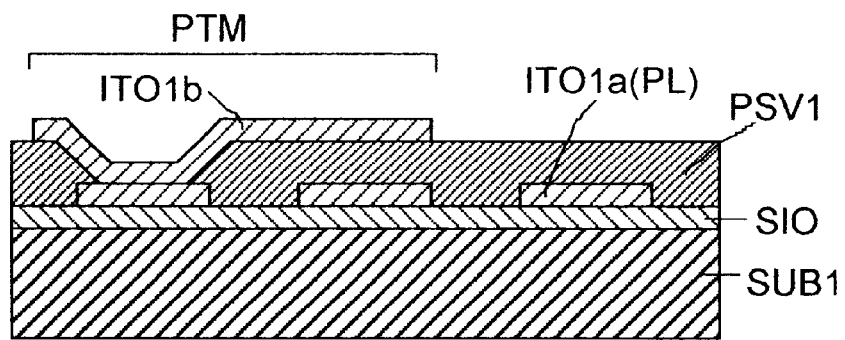

An example, in which the invention is applied to the passive matrix type liquid crystal display device, is shown in FIGS. 33(a) and 33(b). As shown in FIG. 33(a), a plurality of video signal lines PL1 made of a transparent conductive film of the ITO or the like are arranged over a substrate. Over a second substrate confronting that substrate through a liquid crystal layer, there are formed a plurality of video signal lines PL2 (as indicated by broken lines) intersecting the video signal lines PL1, at the stage in which the liquid crystal display device is assembled. These video signal lines PL1 and PL2 form a pair of pixel electrodes PX1 and PX2 in opposed regions. The video signal lines PL1 are fed with video signals from terminals PTR.

At the end portions of the video signal lines, there are provided an inspection terminal PTM for every three video signal lines PL1. The video signal lines PL1 having the inspection terminals are wired in series through the juxtaposed two video signal lines PL1 and wiring lines PS. The disconnection inspection is performed by bringing the inspection probe into contact with the individual inspection terminals PTM and the terminal PSC. The wiring lines PS are made of Cr, a refractory metal, or the like together with the terminals PTR and are removed after the disconnection inspections by cutting the substrates along the cutting lines GCUT1 and GCUT2.

FIG. 33(b) is a section taken along line 33B—33B of FIG. 33(a). The transparent conductor film ITO1a, as formed over the substrate SUB1 through the silicon oxide film SIO, provides the aforementioned video signal line PL1, and the transparent conductor film ITO1b, as formed over the passivation film PSV1 covering the video signal line PL1, provides the aforementioned inspection terminal PTM.

Figure 34A:
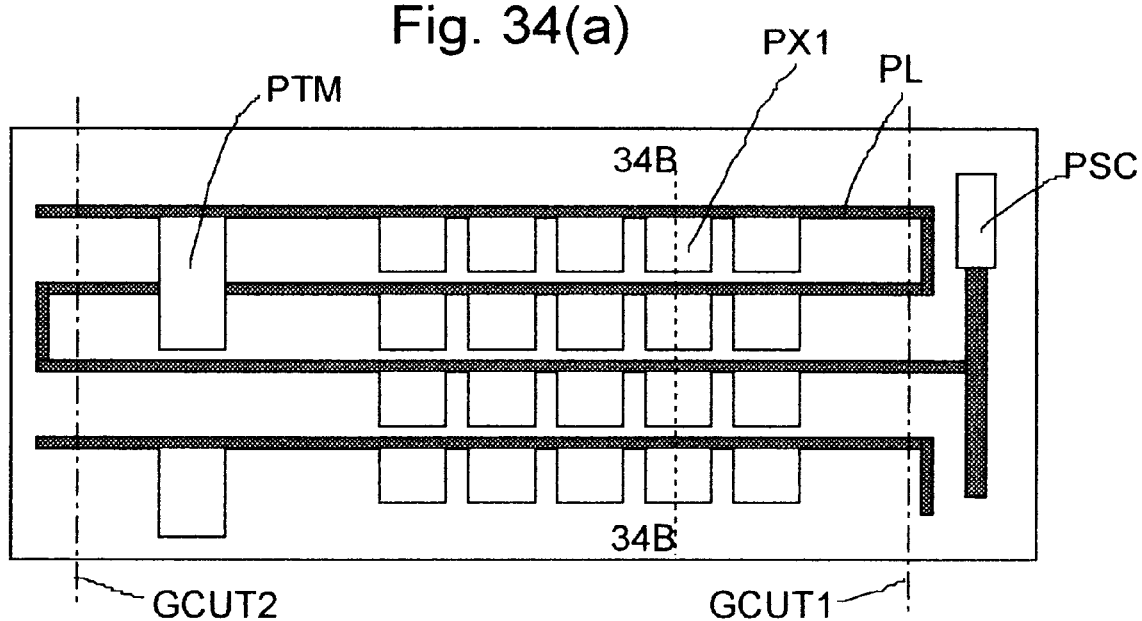
FIGS. 34(*a*) and 34(*b*) are a top plan view and a section showing another example of application to the substrate for the passive matrix type liquid crystal display device and the vicinity of a pixel electrode of the example.
Figure 34B:
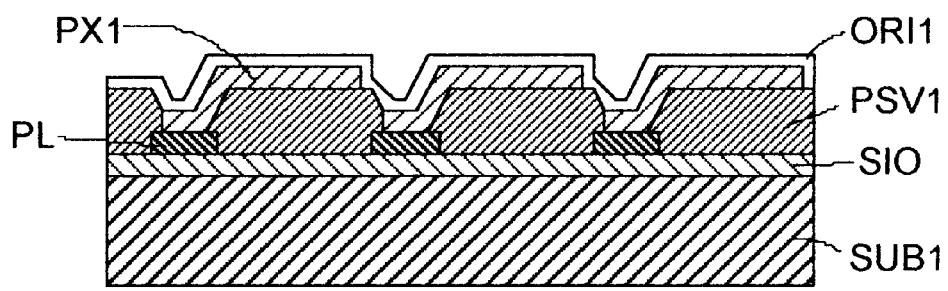

FIGS. 34(a) and 34(b) show an example in which the structure of the aforementioned inspection terminals is applied to the pixel electrodes. As apparent from FIG. 34(a) and FIG. 34(b) presenting the section taken along line 34B—34B of FIG. 34(a), the structure has a video signal line PL and a pixel electrode PX1 functionally divided each other. The former is a conductive layer which is formed over the substrate SUB1 through a silicon oxide film SIO, and its material can be selected regardless of the optical transmittance thereof. On the other hand, the latter is a transparent conductor film which extends from the conductive layer to over the passivation film PSV1 covering the conductive layer. The inspection terminal PTM exhibits a cross sectional shape similar to that of FIG. 5(a).

According to the present invention, as has been described hereinbefore, it is possible to provide a liquid crystal display device having a high yield and a high precision while preventing a defective inspection, which might otherwise be caused by a defective contact between an inspection probe and an inspection terminal at the time of a disconnection inspection in a process for fabricating a TFT substrate.

While we have shown and described several embodiments in accordance with the present invention, it is understood that the same is not limited thereto but is susceptible of numerous changes and modifications as known to those skilled in the art, and we therefore do not wish to be limited to the details shown and described herein but intend to cover all such changes and modifications as are encompassed by the scope of the appended claims.

We claim:

1. A liquid crystal display substrate having a main surface, on which:
   a plurality of gate lines extend in one direction;
   a plurality of data lines extend in another direction transverse to the one direction and are spaced from the plurality of gate lines by a first insulating film;
   switching elements are disposed to be turned ON with scanning signals fed through the gate lines;
   pixel electrodes for feeding video signals from the data lines through the ON switching elements are disposed;
   a second insulating film covers at least partially both the plurality of gate lines and the plurality of data lines;
   wherein at least one of at least two adjacent data lines and at least two adjacent gate lines are electrically connected by at least one wiring line; and
   at least one of the adjacent data lines and the adjacent gate lines connected by the wiring line has an inspection terminal connected thereto which has a portion provided on said second insulating film so as to extend at least partially over at least one of at least two other data lines disposed at one side of the at least one data line and at least two other gate lines disposed at one side of the at least one gate line.

2. A liquid crystal display substrate according to claim 1, wherein the at least one wiring line is disposed at an end portion of said liquid crystal display substrate outside of substrate cutting lines.

3. A liquid crystal display device having the liquid crystal substrate of claim 1,
wherein the main surface of the liquid crystal display is disposed so as to confront another substrate through a liquid crystal layer to form a liquid crystal display panel.

4. A liquid crystal display device comprising a liquid crystal display panel including:
a pair of substrates and a liquid crystal layer, the pair of substrate being arranged to confront one another with the liquid crystal layer disposed therebetween;
a plurality of gate lines and a plurality of data lines, both of the plurality of gate lines and the plurality of data lines being formed on a main surface of one of the substrates adjacent to the liquid crystal layer and spaced from each other by a first insulating film, the plurality of gate lines extending in one direction and being juxtaposed along another direction transverse to the one direction, and the plurality of data lines extending in the another direction and being juxtaposed along the one direction;
switching elements formed on the main surface to be turned ON with scanning signals fed through the plurality of gate lines;
pixel electrodes formed on the main surface for receiving video signals from the plurality of data lines through the ON switching elements; and
a second insulating film formed over the plurality of gate lines, the plurality of data lines and the first insulating film;
wherein at least one of at least one of the plurality of data lines is electrically connected with an inspection terminal, and the inspection terminal extends at least partially over the second insulating film covering at least one of at least two of the plurality of data lines other than the at least one of the plurality of data lines disposed at one side of the plurality of data lines.

5. A liquid crystal display device comprising:
a pair of substrates facing one another with a predetermined distance therebetween, at least one of the pair of substrates having a region provided for displaying an image therein;
a liquid crystal layer sealed between the pair of substrates;
a plurality of first conductive members disposed on one of the pair of substrates to extend along a first direction from a display region on the one of the pair of substrates to a periphery thereof and juxtaposed along a second direction transverse to the first direction;
a first insulating layer covering the first conductive members other than at least one recess exposing a portion of at least one of the first conductive members at the periphery of the display region; and
at least one first terminal layer electrically connected with the at least one of the first conductive members at the portion thereof exposed by the at least one recess and extending from the at least one recess at least partially over the first insulating layer above another of the first conductive members adjacent to the at least one of the first conductive members.

6. The liquid crystal display device according to claim 5, wherein the first insulating layer has a plurality of the recesses for exposing a predetermined number of the first conductive members disposed at a predetermined interval therein respectively, and a plurality of the first terminal layers are formed corresponding to and extending from the respective recesses.

7. The liquid crystal display device according to claim 6, wherein the recesses and the first terminal layers extending therefrom respectively are formed on one side at a periphery of the display region.

8. The liquid crystal display device according to claim 7, further comprising another group of terminals disposed on another side at the periphery of the display region, wherein the first conductive members are extended throughout the display region, and each terminal of the another group is electrically connected with respective one of the first conductive members corresponding thereto.

9. The liquid crystal display device according to claim 7, wherein the first conductive members are extended throughout the display region, and at least one of the first conductive members connected with at least one of the first terminal layers and another of the first conductive members adjacent thereto extend to an opposite edge of the one of the substrates to the periphery at which the first terminal layer is disposed.

10. The liquid crystal display device according to claim 7, wherein the first terminal layers adjacent to one another are disposed alternatively in the first direction.

11. The liquid crystal display device according to claim 6, wherein the plurality of the recesses are formed as respective openings separated from each other by the first insulating layer.

12. The liquid crystal display device according to claim 6, wherein the plurality of the first recesses and the plurality of the terminal layers are formed for every two or more of the first conductive members.

13. The liquid crystal display device according to claim 12, wherein the plurality of the recesses and the plurality of the first terminal layers are formed for every two of the first conductive members, and the first conductive members disposed adjacent to one another are provided for different purpose in the liquid crystal display.

14. The liquid crystal display device according to claim 6, further comprising a plurality of pixel electrodes in the display region with respect to one of the first conductive members, wherein the pixel electrodes are formed on the first insulating layer.

15. The liquid crystal display device according to claim 6, further comprising a plurality of second conductive members other than the first conductive members formed on the one of the pair of substrates, wherein the plurality of second conductive members are substantially parallel to one another and extend in second direction transverse to the first direction and are spaced from the plurality of first conductive members by a second insulating layer.

16. The liquid crystal display device according to claim 15, wherein the plurality of second conductive members are disposed below the plurality of first conductive members, at least one of the second conductive members is connected with a second terminal layer, and the second terminal layer extends over the first insulating layer.

17. The liquid crystal display device according to claim 16, wherein the second terminal layer is connected with a portion of the at least one of the second conductive members exposed by a second recess, and the second recess is formed through the first and second insulating layers so as to extend the second terminal layer at least partially over the first insulating layer above another of the second conductive members adjacent to the at least one of the second conductive members.

18. The liquid crystal display device according to claim 5, wherein the at least one first terminal layer has a surface housing a step with respect to the at least one recess.

19. The liquid crystal display device according to claim 5, wherein the at least one terminal layer extends at least partially over the first insulating layer above at least two other of the first conductive members juxtaposed on one side of the at least one of the first conductive members.

20. The liquid crystal display device according to claim 19, wherein the at least one recess is filled with a material of the terminal layer.

21. A process for fabricating a liquid crystal display panel for a liquid crystal display device comprising the steps of:

preparing a first substrate;

forming a plurality of gate lines and a plurality of data lines disposed on a first main surface of the first substrates so that the plurality of gate lines extend in a first direction, and the plurality of data lines extend in a second direction transverse to the first direction and are spaced from the plurality of gate lines by a first insulating film;

forming at least one wiring line on the first main surface for electrically connecting at least one of at least two adjacent ones of the plurality of data lines and the plurality of gate lines;

forming switching elements on the first main surface to be turned ON with scanning signals fed through the plurality of gate lines;

forming pixel electrodes on the first main surface for feeding video signals from the plurality of data lines through the ON switching elements;

arranging at least one inspection terminal for at least one of the plurality of data lines and the plurality of gate lines so as to extend at least partially over a second insulating film formed above at least one of at least two of the plurality of data lines and at least two of the plurality of gate lines;

arranging the first substrate and a second substrate so as to confront the first main surface to a second main surface of the second substrate with a space therebetween; and sealing a liquid crystal layer in the space between the first and second main surfaces.

22. The liquid crystal display device fabricating process according to claim 21, wherein the at least one wiring line is disposed at an end portion of the first liquid crystal display substrate outside of a substrate cutting line thereof.

23. The liquid crystal display device fabricating process according to claim 21, further comprising the step of:

inspecting disconnection of the at least one of the plurality of data lines and the plurality of gate lines utilizing the at least one inspection terminal.

24. The liquid crystal display device fabricating process according to claim 23, further comprising the step of:

cutting the first substrate and the at least one wiring line after the inspection of disconnection of the at least one of the plurality of data lines and the plurality of gate lines.

25. A process for fabricating a liquid crystal display device comprising the steps of:

preparing a first substrate having a first main surface including a display region provided for displaying an image therein;

forming a plurality of first conductive members on the first main surface so as to be extend along a first direction from the display region to a periphery thereof and to be juxtaposed along a second direction transverse to the first direction;

forming a first insulating film over the plurality of first conductive members;

forming a plurality of openings in the first insulating film, each of the openings being provided in at least one of the display region and a periphery of the display region and each of the openings formed in the periphery exposes a portion of at least one of the plurality of first conductive members;

forming a conductive film on the insulating film including the openings; and removing portions of the conductive film so that the conductive film extending from the opening in the display region forms a pixel electrode on the first insulating film and the conductive film extending from the opening in the periphery of the display region extends at least partially over the first insulating film formed above another of the first conductive members adjacent to the at least one of the first conductive members.

26. The process for fabricating the liquid crystal display device according to claim 25, wherein the plurality of openings on the first insulating film are formed by photolithography using a mask having patterns for both the display region and the periphery thereof.

27. The process for fabricating the liquid crystal display device according to claim 25, wherein the portions of the conducive film are removed by photolithography using a mask having patterns corresponding to both the pixel electrode and the terminal in the periphery of the display region.

28. A liquid crystal display device comprising a liquid crystal display panel including:

a pair of substrates and a liquid crystal layer, the pair of substrates being arranged to confront one another with the liquid crystal layer disposed therebetween;

a plurality of gate lines and a plurality of data lines, both of which are formed on a main surface of one of the substrates adjacent to the liquid crystal layer and spaced from each other by a first insulating film, the plurality of gate lines extending in one direction and being juxtaposed along another direction transverse to the one direction, and the plurality of data lines extending in the another direction and being juxtaposed the one direction;

switching elements formed on the main surface to be turned ON with scanning signals fed through the plurality of gate lines;

pixel electrodes formed on the main surface for receiving video signals from the plurality of data lines through the ON switching elements; and a second insulating film formed over the plurality of gate lines, the plurality of data lines, and the first insulating film;

wherein at least one of at least one of the plurality of gate lines is electrically connected with an inspection terminal, and the inspection terminal extends at least partially over the second insulating film covering at least one of at least two of the plurality of gate lines other than the at least one of the plurality of gate lines disposed at one side of the plurality of gate lines.

* * * * *